US012681382B2

(12) United States Patent
Budach et al.

(10) Patent No.: US 12,681,382 B2
(45) Date of Patent: Jul. 14, 2026

(54) METHOD AND APPARATUSES FOR DISPOSING OF EXCESS MATERIAL OF A PHOTOLITHOGRAPHIC MASK

(71) Applicant: Carl Zeiss SMT GmbH, Oberkochen (DE)

(72) Inventors: Michael Budach, Hanau (DE); Christof Baur, Darmstadt (DE); Klaus Edinger, Lorsch (DE); Tristan Bret, Rixheim (FR)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/837,454

(22) Filed: Jun. 10, 2022

(65) Prior Publication Data

US 2022/0299864 A1 Sep. 22, 2022

Related U.S. Application Data

(63) Continuation of application No. 16/700,180, filed on Dec. 2, 2019, now Pat. No. 11,874,598, which is a
(Continued)

(30) Foreign Application Priority Data

Jul. 21, 2017 (DE) .......................... 102017212567.5

(51) Int. Cl.
| | |
|---|---|
| *G03F 1/82* | (2012.01) |
| *B08B 6/00* | (2006.01) |
| *B08B 7/02* | (2006.01) |

(52) U.S. Cl.
CPC .................. *G03F 1/82* (2013.01); *B08B 6/00* (2013.01); *B08B 7/026* (2013.01)

(58) Field of Classification Search
None
See application file for complete search history.

(56) References Cited

U.S. PATENT DOCUMENTS

| | | | |
|---|---|---|---|
| 5,634,230 A | 6/1997 | Maurer | |
| 5,865,901 A * | 2/1999 | Yin | ........................... B08B 3/00 |
| | | | 451/39 |

(Continued)

FOREIGN PATENT DOCUMENTS

| | | | | |
|---|---|---|---|---|
| CN | 103703415 | 4/2014 | ............... | G03F 1/22 |
| DE | 102005004070 | 8/2006 | | |

(Continued)

OTHER PUBLICATIONS

Baur et al., "Nanoparticle manipulation by mechanical pushing: underlying phenomena and real-time monitoring", Nanotechnology 9, pp. 360-364 (1998).

(Continued)

*Primary Examiner* — David P Turocy
(74) *Attorney, Agent, or Firm* — Fish & Richardson P.C.

(57) ABSTRACT

The present application relates to a method for disposing of excess material of a photolithographic mask, wherein the method comprises the following steps: (a) enlarging a surface of the excess material; (b) displacing the enlarged excess material on the photolithographic mask using at least one first probe of a scanning probe microscope; and (c) removing the displaced enlarged excess material from the photolithographic mask.

27 Claims, 15 Drawing Sheets

Related U.S. Application Data continuation of application No. PCT/EP2018/069425, filed on Jul. 17, 2018.

(56) References Cited

U.S. PATENT DOCUMENTS

| | | | |
|---|---|---|---|
| 6,042,738 | A | 3/2000 | Casey, Jr. et al. |
| 6,335,129 | B1 | 1/2002 | Asano et al. |
| 6,339,217 | B1 | 1/2002 | Kley |
| 6,812,460 | B1 | 11/2004 | Stallcup, II et al. |
| 7,670,956 | B2 | 3/2010 | Bret et al. |
| 7,786,403 | B2 | 8/2010 | Koops et al. |
| 8,279,397 | B2 | 10/2012 | Ehm et al. |
| 8,696,818 | B2 | 4/2014 | Robinson et al. |
| 9,909,218 | B2 | 3/2018 | Bret et al. |
| 10,330,581 | B2 | 6/2019 | Robinson et al. |
| 2001/0037994 | A1 | 11/2001 | Ezaki |
| 2004/0119490 | A1 | 6/2004 | Liu et al. |
| 2005/0011862 | A1 | 1/2005 | Sasaki et al. |
| 2005/0087514 | A1 | 4/2005 | Koops et al. |
| 2006/0065627 | A1* | 3/2006 | Clarke ...................... C23F 1/12 |
| | | | 216/17 |
| 2006/0147814 | A1 | 7/2006 | Liang |
| 2006/0228634 | A1 | 10/2006 | Bret et al. |
| 2007/0037071 | A1 | 2/2007 | Noelscher et al. |
| 2007/0048631 | A1 | 3/2007 | Itoh |
| 2007/0184354 | A1 | 8/2007 | Chandrachood et al. |
| 2008/0132151 | A1 | 6/2008 | Iwata et al. |
| 2008/0179282 | A1 | 7/2008 | Chandrachood et al. |
| 2009/0220867 | A1 | 9/2009 | Fujikawa et al. |
| 2010/0186768 | A1* | 7/2010 | Kanamitsu ................ G03F 1/86 |
| | | | 977/863 |
| 2010/0203431 | A1 | 8/2010 | Bret et al. |
| 2011/0192302 | A1 | 8/2011 | Selinidis |
| 2011/0279799 | A1 | 11/2011 | Singer et al. |
| 2012/0100470 | A1 | 4/2012 | Nozawa et al. |
| 2012/0189946 | A1 | 7/2012 | Hashimoto et al. |
| 2012/0273458 | A1* | 11/2012 | Bret .................... H01J 37/3045 |
| | | | 134/4 |
| 2014/0007306 | A1 | 1/2014 | Baur et al. |
| 2014/0113220 | A1 | 4/2014 | Chu |
| 2014/0165236 | A1 | 6/2014 | Budach et al. |
| 2014/0255831 | A1* | 9/2014 | Hofmann .................. G03F 1/72 |
| | | | 118/721 |
| 2014/0268086 | A1* | 9/2014 | Lu ...................... G03F 7/70191 |
| | | | 355/71 |
| 2016/0238928 | A1* | 8/2016 | Huang ...................... G03F 1/74 |
| 2017/0062180 | A1 | 3/2017 | Budach et al. |
| 2017/0292923 | A1 | 10/2017 | Baralia et al. |
| 2020/0103751 | A1 | 4/2020 | Budach et al. |

FOREIGN PATENT DOCUMENTS

| | | | |
|---|---|---|---|
| DE | 112006000129 | 11/2007 | |
| DE | 102011004214 | 8/2012 | |
| DE | 102013203995 | 9/2014 | |
| EP | 2 506 294 | 7/2015 | ........... H01L 21/311 |
| JP | 2010-058222 | 3/2010 | |
| JP | 2014-174552 | 9/2014 | |
| KR | 1020040045418 | 6/2004 | ............. H01L 21/20 |
| KR | 1020070023564 | 2/2007 | .......... H01L 21/027 |
| KR | 1020090050496 | 5/2009 | .......... H01L 21/027 |
| TW | I460763 | 2/2006 | |

OTHER PUBLICATIONS

Beard et al., "An atomic force microscope nanoscalpel for nanolithography and biological applications", Nanotechnology, vol. 20, pp. 1-10 (2009).

The Decision of Rejection issued by the Korean Patent Office for Application No. KR 10-2020-7001886, dated Sep. 17, 2021 (English Translation).

The German Office Action for German Application No. DE 10 2017 212 567.5 dated Feb. 28, 2018.

The International Search Report and Written Opinion of the International Searching Authority for International Application No. PCT/EP2018/069425 dated Oct. 30, 2018.

The Notice of Reasons for Rejection issued by the Korean Intellectual Property Office dated Feb. 3, 2021 (English Language Translation).

Darwich et al., "Manipulation of gold colloidal nanoparticles with atomic force microscopy in dynamic mode: influence of particle-substrate chemistry and morphology, and of operating conditions", Beilstein Journal of Nanotechnology, vol. 2, pp. 85-98 (2011).

Durston et al., "Manipulation of passivated gold clusters on graphite with the scanning tunneling microscope", Appl. Phys. Lett., vol. 72, No. 2, ppl 176-178 (Jan. 12, 1998).

Gallagher et al., "EUVL mask repair: expanding options with nanomachining", Photomask, BACUS, vol. 3, Issue 3, pp. 1-8 (2013).

Jung et al., "The atomic force microscope used as a powerful tool for machining surfaces", Ultramicroscopy, 42-44, pp. 1446-1451 (1992).

Martin et al., "Manipulation of Ag nanoparticles utilizing noncontact atomic force microscopy", Applied Physics Letters, vol. 73, No. 11. pp. 1505-1507 (Sep. 14, 1998).

Requicha, "Nanomanipulation with the Atomic Force Microscope", Nanotechnology Online, ISBN: 9783527628155 (Jul. 15, 2010).

Verbeek et al., "High precision mask repair using nanomachining", 18th European Conference on Mask Technology for Integrated Circuits and Microcomponents, Proceedings of SPIE, vol. 4764, pp. 210-217 (2002).

The First Office Action issued by the Chinese Patent Office for Application No. CN 201880047639.1, dated Feb. 21, 2023 (with English Translation).

The Office Action issued by the Korean Intellectual Property Office for Application No. KR 10-2023-7009037, dated Feb. 28, 2024 (English Translation Only).

* cited by examiner

METHOD AND APPARATUSES FOR DISPOSING OF EXCESS MATERIAL OF A PHOTOLITHOGRAPHIC MASK

CROSS-REFERENCE TO RELATED APPLICATIONS

This application is a continuation of and claims priority under 35 U.S.C. § 120 to U.S. application Ser. No. 16/700, 180, filed on Dec. 2, 2019, which is a continuation of PCT Application PCT/EP2018/069425, filed on Jul. 17, 2018, which claims priority from German Application 10 2017 212 567.5, filed on Jul. 21, 2017. The entire contents of each of these priority applications are incorporated herein by reference.

TECHNICAL FIELD

The present invention relates to a method and apparatuses for disposing of excess material of a photolithographic mask.

BACKGROUND

As a consequence of the growing integration density in the semiconductor industry, photolithography masks have to image increasingly smaller structures on wafers. In terms of photolithography, the trend towards growing integration density is addressed by shifting the exposure wavelength of lithography systems to ever shorter wavelengths. Currently frequently used as a light source in lithography systems is an ArF (argon fluoride) excimer laser that emits at a wavelength of approximately 193 nm.

Lithography systems are being developed today that use electromagnetic radiation in the EUV (extreme ultraviolet) wavelength range (preferably in the range of 10 nm to 15 nm). Said EUV lithography systems are based on a completely new beam guiding concept which preferably uses reflective optical elements, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist arranged on a wafer is due to photolithographic masks, exposure masks, photomasks or just masks. Exposure masks have a pattern of absorbing and/or phase-shifting structure elements that image the pattern to be transferred to a wafer from the mask into a photoresist arranged on the wafer. With every further increase in integration density, it becomes increasingly more important to reduce the minimum structure size of the exposure masks. The production process of photolithographic masks therefore becomes increasingly more complex and as a result more time-consuming and ultimately also more expensive. On account of the tiny structure sizes of the pattern elements which absorb electromagnetic radiation at the actinic wavelength and/or shift the phase of the electromagnetic radiation, faults during mask production cannot be ruled out. These must be repaired—whenever possible. Repairing photomasks involves removing parts of an absorber pattern which are present at mask locations not provided by the design. Furthermore, absorbing material is deposited at locations on the mask which are free of absorbing material even though the mask design provides absorbing pattern elements. Both types of repair processes can produce debris fragments or particles which can settle on transparent or reflective locations of photomasks and which can be visible as imaging aberrations on a wafer.

Furthermore, there are dirt particles from the environment which settle on the surface of a mask. These are removed as standard from the surface of the masks by cleaning steps during mask production and during operation of the masks. The decreasing structural dimensions of photolithographic masks are increasing the difficulty of cleaning processes. Moreover, as a result of the decreasing exposure wavelength, ever smaller foreign or dirt particles adsorbed on the surface of the mask are becoming visible during an exposure process on a wafer.

In the article "The atomic force microscope used as a powerful tool for machining surfaces," Ultramicroscopy, 42-44 (1992), pages 1446-1451, the authors T. A. Jung et al. explain various methods for producing and imaging small structures in polycarbonate surfaces using a probe of an atomic force microscope.

In the article "Manipulation of gold colloidal nanoparticles with atomic force microscopy in dynamic mode: influence of particle—substrate chemistry and morphology, and operating conditions," Beilstein J. Nanotechnol., Vol. 2 (2011), pages 85-98, the authors S. Darwich et al. investigate the influence of various parameters on the movement of colloidal gold nanoparticles, which is induced by a probe of an atomic force microscope.

In the publication "EUVL mask repair: expanding options with nanomachining," BACUS, Vol. 3, issue 3 (2013), pages 1-8, the authors E. Gallagher et al. demonstrate the use of an atomic force microscope for removing parts of a pattern element and a part of the multilayer structure in order to compensate for a defect of the multilayer structure of a photomask for the extreme ultraviolet wavelength range that produces a phase and amplitude error.

The authors M. Martin et al. describe in the publication "Manipulation of Ag nanoparticles utilizing noncontact atomic force microscopy", Appl. Phys. Lett., Vol. 72, No. 11, September 1998, pages 1505-1507, displacing gold nanoparticles on silicon dioxide substrates using the probe of an atomic force microscope, wherein the probe is operated in a non-contact operating mode.

In the article "Manipulation of passivated gold clusters on graphite with the scanning tunneling microscope," Appl. Phys. Lett., Vol. 72, No. 2, January 1998, pages 176-178, the authors P. J. Durston et al. describe investigations of chemically passivated gold nanoclusters deposited on a graphite surface, with the aid of a scanning tunnelling microscope.

In the article "Nanomanipulation with the atomic force microscope," Nanotechnology Online, ISBN: 9783527628155, the author A. Requicha gives an overview of studies for manipulating nanoparticles and presents the essential features of an automated manipulation system.

The authors C. Baur et al. describe in the publication "Nanoparticle manipulation by mechanical pushing: underlying phenomena and real-time monitoring," Nanotechnology 9 (1998), pages 360-364, details of processes for displacing beads of gold on a substrate, which are carried out with the aid of a probe of a scanning probe microscope.

In the article "An atomic force microscope nanoscalpel for nanolithography and biological applications," the authors J. D. Beard et al., Nanotechnology 20 (2009), 445302, pages 1-10, describe the production and the application of blade-like structures at the tip of a probe of an atomic force microscope and the application thereof for examining biological material and for cutting metal foils.

The US patent specification U.S. Pat. No. 6,812,460 B1 describes a nanomanipulation method in which a probe of a scanning probe microscope carries out a circular movement around a nanoparticle that is movable on a surface, wherein a linear movement component is superimposed on the circular movement of the probe.

The patent publication DE 10 2013 203 995 A1 describes an apparatus and a method for protecting a substrate during processing with a particle beam. The patent publication DE 10 2011 004 214 A1 describes an apparatus and a method for analyzing and modifying a sample surface with a probe array of scanning probe microscope.

The patent publication DE 11 2006 000 129 T5 describes a method to repair an APSM (alternative phase shift mask) having undercut etch using an atomic force microscope and applying e-beam induced etch and deposition processes.

The patent DE 10 2005 004 070 B3 describes a method for removing defective material from a photomask. In a first step the defective and absorbing mask material are removed and in a second step missing absorbing material is again deposited onto the photomask.

The US patent specification U.S. Pat. No. 8,696,818 B2 describes a system for removing debris fragments from a surface of a photolithographic mask. A measurement tip of a probe of a scanning microscope is coated with a material having low surface energy and is moved over the surface of the mask. The debris fragments adhere physically to the coated measurement tip and are removed from the surface of the mask together with the measurement tip.

The documents cited above predominantly describe the movement of nanoparticles with the objective of shaping nanostructures on a surface. The patent specification cited last describes the alteration of probes of scanning probe microscopes for the purpose of removing particles from a photomask.

The present invention therefore addresses the problem of specifying a method and apparatuses such that probes of conventional scanning probe microscopes can be used for disposing of excess material from a photolithographic mask.

SUMMARY

In accordance with one exemplary embodiment of the present invention, this problem is solved by a method for disposing of excess material of a photolithographic mask, in which the method comprises the following steps: (a) enlarging a surface of the excess material; (b) displacing the enlarged excess material on the photolithographic mask using at least one first probe of a scanning probe microscope; and (c) removing the displaced enlarged excess material from the photolithographic mask.

Increasing a surface of an excess material which has to be removed from a photolithographic mask facilitates the handling of the enlarged excess material during the further process step for disposing of the enlarged excess material.

Enlarging the surface of the excess material can be carried out by use of a particle beam induced process.

Enlarging the surface area of the displaced excess material creates a larger area of application for a flowing cleaning fluid, thereby enabling the latter to overcome the adhesion force of the displaced excess material and, as a result, to flush the displaced enlarged excess material from the surface of the photomask. Further, the larger area of application also improves processing of the enlarged excess material with a probe of a scanning probe microscope.

In a further embodiment the method for disposing of excess material of a photolithographic mask comprises the following steps: (a) displacing the excess material on the photolithographic mask using at least one first probe of a scanning probe microscope; and (b) fixing the displaced excess material on the photolithographic mask; or (c) removing the displaced excess material from the photolithographic mask without using the at least one first probe of the scanning probe microscope.

In one exemplary embodiment, the method according to the invention comprises a two-stage process for disposing of excess material of a photolithographic mask. In a first step, the excess material is moved. In some cases, it is already sufficient to displace the excess material only a small distance (for instance a few nanometres) on a mask surface because, as a result, the anchoring of the excess material to the surface of the photomask is destroyed and the displaced excess material can then be removed by conventional cleaning methods. Furthermore, the excess material can be displaced to locations of the photomask which are accessible to a cleaning process more easily than the location(s) at which the excess material was originally adsorbed on the mask. Said locations can for example be absorbing pattern elements of photolithographic masks.

In an alternative embodiment of a method according to the invention, the displaced excess material is not removed from the mask, but rather fixed at the displaced position in a second step. Immobilizing the excess material remaining on the mask makes it possible to prevent the excess material from settling, in the course of operation of the mask, at locations at which it leads to printable defects, i.e. defects visible on a wafer.

The two-stage method according to the invention has the advantage that standard components of a mask production process can be used for disposing of excess material from a photolithographic mask. Furthermore, the alternative embodiment of the second step opens up flexible situation-adapted guidance of the process for disposing of excess material.

Displacing the excess material can comprise causing the at least one first probe of the scanning probe microscope to interact with the excess material and/or carrying out at least one relative movement between the at least one first probe and the photolithographic mask. Disposing the excess material can also comprise causing the at least one first probe of the scanning probe microscope to interact with the enlarged excess material. Disposing the excess material can further comprise carrying out at least one relative movement between the at least one probe and the photolithographic mask.

The probe of a scanning probe microscope (SPM) can be caused to interact with the excess material or the enlarged excess material by use of a plurality of forces or potentials. If the excess material is electrically charged, an electrical voltage can be applied to an electrically conductive probe or a semiconducting probe, such that a long-range electrostatic interaction occurs as the probe approaches the excess material or the enlarged excess material. To that end, an electrical voltage having the same polarity as the electrical charge of the excess material can be applied to the probe. As a result, the charged probe pushes the electrically charged excess material or the electrically charge enlarged excess material in front of it as the probe approaches.

The probe of an atomic force microscope (AFM) can be used for displacing the excess material. As a probe of the AFM approaches the excess material or the enlarged excess material, the attractive van der Waals and capillary forces are dominant at a distance of a few nanometers, while strongly repulsive forces gain the upper hand for even smaller distances between probe and excess material or the enlarged excess material on account of the Pauli principle. Repulsive forces can be used for moving the excess material or the enlarged excess material on the surface of a photomask. In a similar manner to that in the above-described case of an electrostatic interaction, it is possible to use the probe such that it pushes the excess material or the enlarged excess material in front of it.

Moreover, it is possible to move ferromagnetic samples with the aid of a ferromagnetic probe. Finally, it is conceivable to use probes for displacing the excess material or the excess material which use acoustic waves and/or evanescent optical waves for interaction with the excess material.

A relative movement between the probe and the excess material or the enlarged excess material can be carried out by moving the probe, by moving the photolithographic mask or by a combined movement of the probe and the photolithographic mask.

Displacing the excess material or the enlarged excess material can comprise displacing the excess material or the enlarged excess material from a transmissive or a reflective region of the photolithographic mask into a region of an absorbing pattern element of the photolithographic mask.

Excess material or enlarged excess material that is present on an absorbing pattern element does not become visible on a wafer during an exposure process of the mask and thus does not disturb the exposure process, or disturbs it only to an insignificant extent.

The method for disposing of excess material can furthermore comprise the following steps: producing a first temporary auxiliary structure and displacing the excess material or the enlarged excess material via the first temporary auxiliary structure onto a pattern element of the photolithographic mask. The first temporary auxiliary structure can comprise a ramp connecting a transmissive or a reflective region of the photolithographic mask to an absorbing pattern element of the photolithographic mask.

The first temporary structure is accordingly used to overcome the difference in height between the transmissive or reflective region and the upper edge of an absorbing pattern element during the transport of the excess material or the enlarged excess material from the starting point to the destination point.

The method for disposing of excess material can furthermore comprise the following steps: producing a second temporary auxiliary structure and displacing the excess material onto the second temporary auxiliary structure. Further, the method for disposing excess material can also comprise: producing a temporary auxiliary structure and displacing the enlarged excess material onto the temporary auxiliary structure. The second temporary auxiliary structure can comprise an area in a transmissive or reflective region of the photolithographic mask onto which material is deposited.

The temporary auxiliary structure or second temporary auxiliary structure can be a type of sacrificial layer which is deposited in proximity to the excess material or the enlarged excess material and facilitates the disposal of the excess material and the excess material, respectively, by removal from the photolithographic mask.

Producing the first temporary auxiliary structure can be carried out by use of a first particle beam and at least one first deposition gas, and/or producing the second temporary auxiliary structure can be carried out by use of a first particle beam and at least one second deposition gas.

The first temporary auxiliary structure and/or the second temporary auxiliary structure can comprise a combination of the elements molybdenum (Mo), carbon (C) and oxygen ($O_2$) or a combination of the elements Mo and $O_2$.

It is possible for the deposit of the temporary auxiliary structure, first and of the second temporary auxiliary structure to comprise a large proportion of carbon. A large proportion of carbon in the deposit limits the structural stability thereof and thereby enables simple removal of the temporary auxiliary structure, the first and of the second temporary auxiliary structure.

The method for disposing of excess material can furthermore comprise the step of: removing the first temporary auxiliary structure by use of a second particle beam and at least one first etching gas. Further, the method for disposing of enlarged excess material can also comprise the step of: removing the temporary auxiliary structure by use of the second particle beam and at least one first etching gas. As explained above, the material of the first temporary auxiliary structure can be chosen from the standpoint that the auxiliary structure can be removed again from the photomask in a simple manner.

The method for disposing of excess material can furthermore comprise the following step: removing the second temporary auxiliary structure together with the excess material situated thereon from the photolithographic mask in a cleaning process for the photolithographic mask. Furthermore, the method for disposing excess material can furthermore comprise the step: removing the temporary auxiliary structure together with the enlarged excess material situated thereon from the photolithographic mask in a cleaning process for the photolithographic mask.

The method for disposing of excess material can furthermore comprise the following step: removing the second temporary auxiliary structure together with the excess material situated thereon from the photolithographic mask by use of a second particle beam and at least one second etching gas. The method for disposing of excess material can also comprise the step: removing the temporary auxiliary structure together with the enlarged excess material situated thereon from the photolithographic mask by use of a second particle beam and at least one second etching gas.

Removing the displaced enlarged excess material from the photolithographic mask can be carried out without using the at least one probe of the scanning probe microscope.

For example, the enlarged excess material can be removed from the photolithographic mask by performing a cleaning process.

Removing the displaced enlarged excess material from the photolithographic mask can be carried out by using the at least one first probe of the scanning probe microscope.

As already explained above enlarging the surface of excess material eases the further processing of the excess material. An enlarged surface of excess material can enable a removal of the enlarged excess material without displacing the enlarged excess material. The removal of the enlarged excess material can be carried out with a probe of a scanning probe microscope.

The at least one first probe can electrostatically interact with the displaced enlarged excess material for removing the displaced enlarged excess material.

Removing the displaced enlarged excess material can comprise the step: establishing a mechanical connection between the at least one first probe and the displaced enlarged excess material by depositing material on the at least one first probe and/or the displaced enlarged excess material.

The deposition of material for connecting the at least one first probe and the displaced enlarged excess material can be performed by using the process described for depositing the temporary auxiliary structure, the first or the second temporary auxiliary structure.

Removing the displaced enlarged excess material can comprise the step: separating the mechanical connection between the at least one first probe and the displaced enlarged excess material by use of a particle beam induced etching process.

The separation of the mechanical connection can be executed with an etching process which is similar to the etching process for etching the temporary auxiliary structure, the first or the second temporary auxiliary structure.

The method for disposing excess material can comprise the step: monitoring displacing and/or removing the excess material or the enlarged excess material using a particle beam microscope. The particle beam microscope may be an optical microscope and/or may be a scanning electron microscope.

Furthermore, the method for disposing of excess material can comprise the following step: modifying at least one pattern element of the photolithographic mask for facilitating the process of displacing the excess material. Modifying the at least one pattern element can comprise: at least partly removing a pattern element using the at least one probe and/or by use of a second particle beam and at least one third etching gas.

Partly removing a pattern element of a photomask can realise two different advantages. Firstly, the probe can thereby obtain access to excess material which is deposited on the mask at locations at which the probe cannot be used or can be used only with difficulty for displacing the excess material. Secondly, partly removing a pattern element makes it possible to create space within a pattern element wherein the excess material can be accommodated, incorporated or embedded.

Partly removing a pattern element can comprise partly removing the pattern element over the entire depth thereof or only part of the depth of the pattern element. Partly removing a pattern element can be carried out by use of a local EBIE (Electron Beam Induced Etching) process. Alternatively, a probe of the scanning probe microscope can be used for mechanically removing a part of a pattern element. Furthermore, it is possible to combine both processes for partly removing a pattern element.

Moreover, the method for disposing of excess material can comprise the following step: localizing the excess material using the at least one probe and/or localizing the excess material by use of a third particle beam.

The first, second and the third particle beam can comprise a charged particle beam, in particular an electron beam. It is also possible to use other particle beams, for example an ion beam, an atom beam or a photon beam. The first, second and the third particle beam can be same type of particle beam and differ in one or more parameters, such as, for instance, energy, beam diameter, etc. It is also possible for the first, second and third particle beam to comprise different types of particle beam.

Displacing the excess material can comprise: tilting the at least one first probe relative to the longitudinal axis thereof for the purpose of localizing and/or for the purpose of displacing the excess material or the enlarged excess material.

If the excess material has a high aspect ratio, it can be expedient to tilt and/or to rotate the probe relative to the longitudinal axis thereof in order to be able to reproducibly scan the excess material. Furthermore, it can be advantageous to tilt the probe or the measurement tip thereof for a process of displacing the excess material, in order to enlarge its contact area with the excess material to be displaced, in particular in the cases in which the excess material is intended to be displaced over a non-horizontal area.

The at least one first probe can comprise a probe arrangement comprising a first probe and a second probe and the method for disposing of excess material can furthermore comprise the following step: localizing the excess material using the first probe and displacing the localized excess material using the second probe of the scanning probe microscope. The second probe can have at its free end a planar structure which is arranged at an angle of ±30°, preferably ±20°, more preferably ±10°, and most preferably ±5°, with respect to the normal to the free end of the probe.

The probe arrangement can comprise a third probe for at least partly removing an absorbing pattern element of the photolithographic mask. The probe arrangement can comprise a fourth probe for at least partly removing the first temporary auxiliary structure.

The use of a probe arrangement or of a probe array comprising two or more probes in a scanning probe microscope has the advantage that a probe that is designed for a specific task can be used for each task of the scanning probe microscope. As a result, the individual tasks of the SPM can be performed with greater precision, which results in a higher success rate during the processing of the individual tasks by the SPM.

Fixing the displaced excess material can comprise: depositing material around the displaced excess material by use of a first particle beam and at least one third deposition gas.

By embedding the displaced excess material in material deposited around the excess material, the excess material is fixed or immobilized. During the operation of the photomask or by use of a cleaning process for the mask, the displaced excess material can no longer leave its new position.

Fixing the displaced excess material can comprise: fixing on a pattern element of the photolithographic mask and/or fixing in the modified region of the modified pattern element.

The displaced excess material can be fixed on a photolithographic mask in at least two different ways. Firstly, the displaced excess material can be fixed on a pattern element by depositing material around the excess material displaced onto the absorbing pattern element. This process implementation has the advantage that the pattern elements present on the mask do not have to be altered. What is disadvantageous, by contrast, is that the pattern element on which the displaced excess material is fixed has a greater height locally than the rest of the pattern elements.

Secondly, the displaced excess material can be accommodated or "hidden" in a modified region of a pattern element. In this alternative, it is expedient that the external dimensions of the photomask are not changed by the disposal of the excess material. By contrast, it is disadvantageous that this second alternative requires partial removal of a pattern element.

Fixing or immobilizing the excess material presupposes that the dimensions of the excess material are smaller than the dimensions of the pattern elements of the photomask on which the excess material is situated. If this condition is not met, the displaced and then fixed excess material leads to a defect visible on a wafer during an exposure process of the mask. However, this condition of a maximum size of the excess material does not constitute an appreciable limitation of the above-defined disposal method for excess material. On the one hand, it is possible to remove excess material that does not fulfil the condition mentioned above, i.e. large particles of excess material, from the photomask in a cleaning process. This is the preferred procedure. On the other hand, however, it is also possible for excess material whose size exceeds the dimensions of pattern elements and which resists a cleaning process to be decomposed, prior to displacement, into smaller debris fragments that satisfy the prerequisite mentioned above. The probe of an SPM, preferably a probe of a probe arrangement specifically designed for this purpose, can be used for decomposing excessively large excess material.

Removing the displaced excess material or the enlarged excess material can be carried out by a cleaning process for the photolithographic mask. The cleaning process can be carried out in the context of a customary cleaning step during mask production or mask operation. However, the cleaning process can also be carried out as a special cleaning procedure that is designed to remove the displaced excess material or the enlarged displaced excess material from the sample surface.

The method for removing excess material can additionally comprise the following step: enlarging a surface area of the displaced excess material before carrying out the cleaning process. Further, the method for removing enlarged excess material may comprise the step: enlarging the surface of excess material before moving the enlarged excess material.

Enlarging the surface area of the displaced excess material can comprise depositing additional material onto the displaced excess material. Depositing the additional material onto the displaced excess material can be carried out by use of the first particle beam and at least one fourth deposition gas.

As already explained above, it can be expedient if the first and second deposition gases contain constituents such that the deposits thereof lead to a temporary auxiliary structure or a first and a second temporary auxiliary structure which can be removed again from the photolithographic mask in a simple manner.

In one exemplary embodiment, the third deposition gas can lead to a deposit which firstly has a high absorption coefficient at the actinic wavelength of the photomask and secondly withstands the loadings to which the mask is subjected during a large number of exposure cycles and a number of cleaning processes, substantially without changes in its imaging properties.

Here and elsewhere in this application, the expression "substantially" denotes an indication of a measurement variable within its error tolerances when the measurement variable is measured using measuring instruments in accordance with the prior art.

The requirement to be made of the fourth deposition gas is that the deposit thereof adheres well on the displaced excess material. Moreover, it is expedient if the fourth deposition gas can be deposited on the displaced excess material without a great outlay.

The first, second and the fourth deposition gas can comprise a metal alkyl, a transition element alkyl and/or a main group element alkyl. The metal alkyl, the transition element alkyl or the main group element alkyl can comprise: cyclopentadienyl- (Cp) trimethylplatinum (CpPtMe$_3$), methylcyclopentadienyl- (MeCp) trimethylplatinum (MeCpPtMe$_3$), tetramethyltin (SnMe$_4$), trimethylgallium (GaMe$_3$), ferrocene cyclodienyl (Cp$_2$Fe), dimethylgold hexafluoroacetyl acetonate (C$_7$H$_7$F$_6$O$_2$Au), trimethylaluminium (Al(CH$_3$)$_3$), triisobutylaluminium (Al(C$_4$H$_9$)$_3$), copper hexafluoroacetyl acetonate ((C$_5$HF$_6$O$_2$)Cu(CH$_3$)), and ferrocene (Fe(C$_5$H$_5$)$_2$).

The first, second, third and the fourth deposition gas can comprise a metal carbonyl, transition element carbonyl and/or a main group element carbonyl. The metal carbonyl, the transition element carbonyl or the main group element carbonyl can comprise: chromium hexacarbonyl (Cr(CO)$_6$), molybdenum hexacarbonyl (Mo(CO)$_6$), tungsten hexacarbonyl (W(CO)$_6$), dicobalt octacarbonyl (Co$_2$(CO)$_8$), triruthenium dodecacarbonyl (Ru$_3$(CO)$_{12}$), and iron pentacarbonyl (Fe(CO)$_5$).

The first, second and fourth deposition gas can comprise a metal alkoxide, a transition element alkoxide and/or a main group element alkoxide. The metal alkoxide, the transition element alkoxide or the main group element alkoxide can comprise: tetraethyl orthosilicate (TEOS, Si(OC$_2$H$_5$)$_4$) and titanium isopropoxide (Ti(OCH(CH$_3$)$_2$)$_4$).

The first, second and fourth deposition gas can comprise a metal halide, a transition element halide and/or a main group element halide. The metal halide, the transition element halide or a main group element halide can comprise: tungsten hexachloride (WCl$_6$), titanium tetrachloride (TiCl$_4$), boron trichloride (BCl$_3$) and silicon tetrachloride (SiCl$_4$).

The first, the second, the third and the fourth deposition gas can be identical and can comprise a single deposition gas. The first, the second, the third and the fourth deposition gas can comprise four different deposition gases. Furthermore, the first, the second and the third deposition gas can comprise two or three different deposition gases. Moreover, it is possible for the first, the second, the third and the fourth deposition gas to comprise a combination of two or more deposition gases.

Furthermore, at least one additive gas comprising an oxidant can be admixed with the first, second, third and/or the fourth deposition gas. The oxidant can comprise: oxygen (O$_2$), ozone (O$_3$), water vapor (H$_2$O), hydrogen peroxide (H$_2$O$_2$), dinitrogen monoxide (N$_2$O), nitrogen monoxide (NO), nitrogen dioxide (NO$_2$) and nitric acid (HNO$_3$).

Moreover, the additive gas can comprise a gas having a reducing effect. The gas having a reducing effect can comprise: hydrogen (H$_2$), ammonia (NH$_3$) and methane (CH$_4$).

The first, second and the third etching gas can comprise: xenon difluoride (XeF$_2$), xenon dichloride (XeCl$_2$), xenon tetrachloride (XeCl$_4$), XNO, XNO$_2$, XONO$_2$, X$_2$O, XO$_2$, X$_2$O$_2$, X$_2$O$_4$ and X$_2$O$_6$, wherein X is a halogen.

The first etching gas is used in order that, in combination with a second particle beam, the first temporary auxiliary structure is removed again from the mask after the process for displacing the excess material has been carried out. The second temporary auxiliary structure serves merely as a carrier material for the excess material to be displaced, and the temporary auxiliary structure serves as a carrier material for the enlarged excess material. Since the different temporary auxiliary structures only have to withstand the process of transporting the excess material or the enlarged excess material, a low structural stability of said auxiliary structures is sufficient. This facilitates the removal of said auxiliary structures, specifically independently of the means used for eliminating them.

In contrast thereto, the pattern elements of a photomask have a high structural stability, such that the processing thereof necessitates a specific parameter setting for the combination of a third etching gas and the second particle beam. As necessary, the selectivity of the local etching process is increased by addition of an additive gas.

The first, the second and the third etching gas can comprise a single etching gas. The first, the second and the third etching gas can comprise different etching gases. Furthermore, it is possible for the first, the second and the third etching gas to comprise in each case a mixture of two or more etching gases.

The excess material can comprise particles having a diameter of 1 nm to 200 nm, preferably 2 nm to 100 nm, more preferably 3 nm to 60 nm, and most preferably 4 nm to 50 nm.

In accordance with a further exemplary embodiment of the present invention, the problem mentioned above is solved by an apparatus for disposing of excess material of a photolithographic mask, in which the apparatus comprises: (a) at least one means which is configured to enlarge a surface of the excess material; (b) at least one probe of a scanning probe microscope which is configured to displace the enlarged excess material on the photolithographic mask; and (c) at least one means which is configured to remove the displaced enlarged excess material from the photolithographic mask.

The at least one means which is configured to enlarge the surface of the excess material may comprise a particle beam-induced deposition apparatus.

The at least one means which is configured to remove the displaced enlarged excess material may comprise at least one probe of a scanning probe microscope or at least one cleaning apparatus which is configured to remove the displaced enlarged excess material from the photolithographic mask.

The apparatus for disposing of excess material of a photolithographic mask may further comprise a particle beam microscope which is configured to monitor displacing and/or removing the enlarged excess material.

The at least one means which is configured to enlarge the surface of the excess material is further configured to establish a mechanical connection between the displaced enlarged excess material and the at least one probe.

Further, the apparatus for disposing of excess material of a photolithographic mask may further comprise at least one means which is configured to separate the mechanical connection between the displaced enlarged excess material and the at least one probe.

In one embodiment, an apparatus for disposing of excess material of a photolithographic mask comprises: (a) at least one probe of a scanning probe microscope which is configured to displace the excess material on the photolithographic mask; and (b) at least one means which is configured to fix the displaced excess material on the photolithographic mask.

According to yet another exemplary embodiment, an apparatus for disposing of excess material of a photolithographic mask comprises: (a) at least one probe of a scanning probe microscope which is configured for displacing the excess material on the photolithographic mask; and (b) at least one cleaning apparatus which is configured to remove the displaced excess material from the photolithographic mask.

The at least one probe can be configured to displace the excess material from a transmissive or a reflective region of the photolithographic mask into a region of an absorbing pattern element of the photolithographic mask.

The at least one probe can comprise a probe arrangement comprising a first probe and a second probe, wherein the first probe is configured to localize the excess material and the second probe is configured to displace the excess material on the photolithographic mask.

The second probe can have at its free end a planar structure arranged at an angle of ±30°, preferably ±20°, more preferably ±10°, and most preferably ±5°, with respect to the normal to a longitudinal direction of a cantilever of the probe at the free end of the cantilever.

The planar structure of the second probe can comprise a width of 5 nm to 10 μm, preferably 10 nm to 1 μm, more preferably 15 nm to 100 nm, and most preferably 20 nm to 60 nm, and/or the planar structure can comprise a height of 30 nm to 10 μm, preferably 50 nm to 5 μm, more preferably 70 nm to 2 μm, and most preferably 100 nm to 1 μm, and/or the planar structure can comprise a thickness of 50 nm to 2 μm, preferably 70 nm to 1 μm, more preferably 90 nm to 500 nm, and most preferably 100 nm to 300 nm.

The means of the apparatus which is configured to fix the displaced excess material can comprise: at least one source for at least one first particle beam and at least one container for storing at least one deposition gas, and wherein the at least one first particle beam is configured to alter the at least one deposition gas in a local chemical reaction for the purpose of depositing material around the displaced excess material.

The at least one means of the apparatus which is configured to fix the displaced excess material can comprise: (a) at least one source for a first particle beam configured to initiate the deposition of a first temporary auxiliary structure, of a second temporary auxiliary structure, of absorbing material around the displaced excess material, of absorbing material for at least one pattern element of the photolithographic mask, and/or for depositing additional material onto the displaced excess material; (b) at least one source for a second particle beam configured to initiate a local etching process of a pattern element of the photolithographic mask, of the first temporary auxiliary structure and/or of the second temporary auxiliary structure; (c) at least one source for a third particle beam configured for analyzing the photolithographic mask, the first temporary auxiliary structure, the second temporary auxiliary structure and/or the excess material; (d) a first container configured for storing a first deposition gas; (e) a second container configured for storing a second deposition gas; (f) a third container configured for storing a third deposition gas; (g) a fourth container configured for storing a fourth deposition gas; (h) a fifth container configured for storing a first etching gas; (i) a sixth container configured for storing a second etching gas; and (j) a seventh container configured for storing a third etching gas.

Furthermore, the apparatus can comprise a deposition apparatus configured to enlarge a surface area of the displaced excess material. The deposition apparatus can comprise at least one source for at least one first particle beam and at least one seventh container for storing at least one fourth deposition gas.

Moreover, the apparatus for disposing of excess material of a photolithographic mask can comprise a first probe of a first scanning probe microscope and a second probe of a second scanning probe microscope.

The first, second and the third particle beam can comprise a charged particle beam, in particular an electron beam. It is also possible to use other particle beams, for example an ion beam, an atom beam or a photon beam. The first, second and the third particle beam can be same type of particle beam and differ in one or more parameters, such as, for instance, energy, beam diameter, etc. It is also possible for the first, second and third particle beam to comprise different types of particle beam.

According to one aspect, a computer program comprises instructions which, when they are executed by a computer system, cause the computer system to instruct one of the apparatuses mentioned above to carry out the method steps of the aspects described above.

DESCRIPTION OF DRAWINGS

The following detailed description describes currently preferred exemplary embodiments of the invention, with reference being made to the drawings, in which.

DETAILED DESCRIPTION

Currently preferred embodiments of apparatuses according to the invention and of a method according to the invention for disposing of excess material on a photolithographic mask are explained in greater detail below. However, the apparatuses according to the invention and the method according to the invention are not restricted to the examples discussed below. Rather, these can be used for arbitrary scanning probe microscopes and/or arbitrary photomasks.

Figure 1:
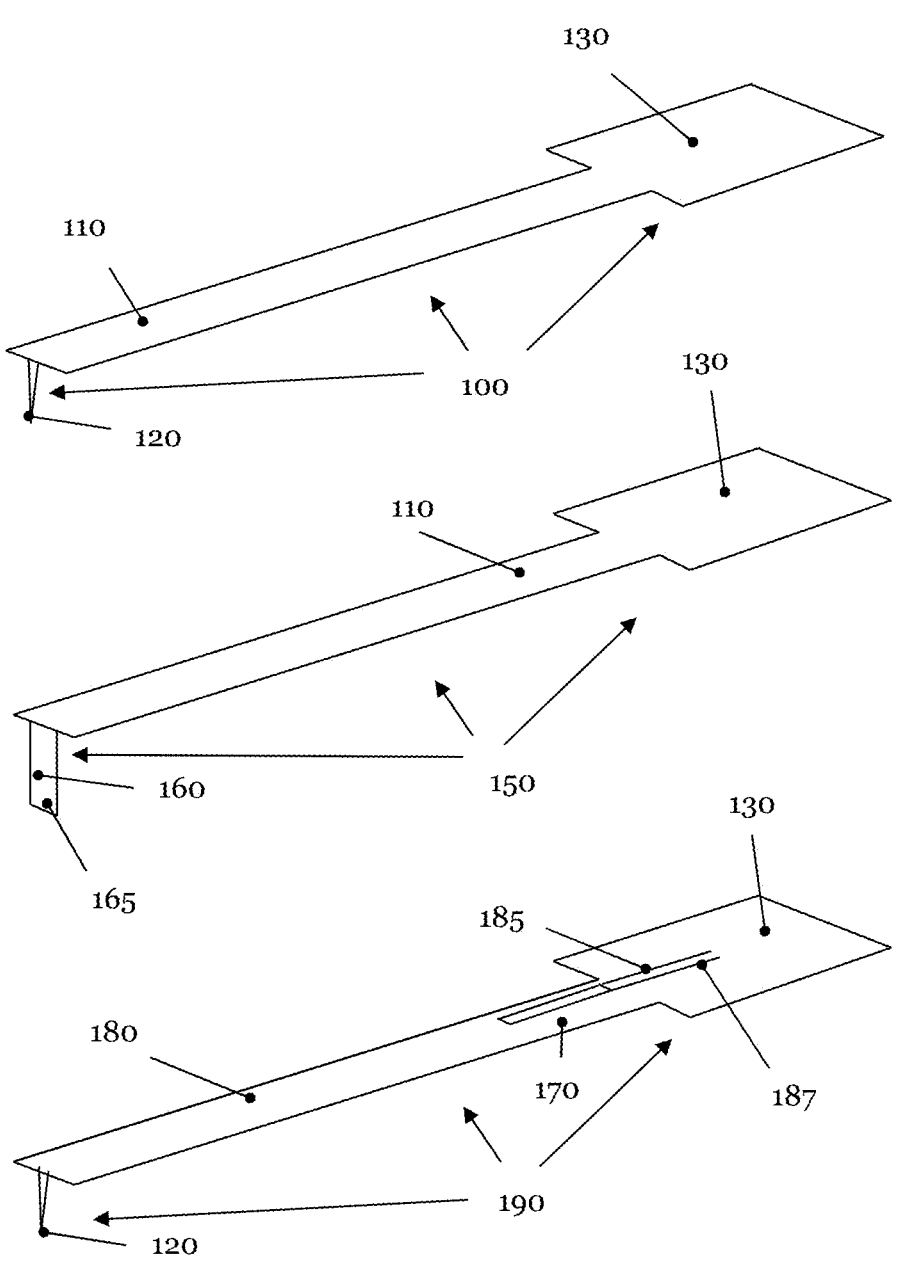
FIG. 1 schematically shows three examples of probes of a scanning probe microscope.

FIG. 1 shows a probe 100 of a scanning probe microscope in the upper subfigure. The probe 100 or measurement probe 100 comprises a bending beam 110 or a lever arm 110. The bending beam 110 hereinafter—as customary in the technical field—is referred to as cantilever 110. The cantilever 110 of the probe 100 has a measurement tip 120 at one end (the free end). In the example of the upper subfigure in FIG. 1, the measurement tip 120 comprises an elongated thin tip having a small radius of curvature, which tip is suitable for analyzing a sample surface. (The expressions sample and photomask are used as synonyms hereinafter.) At the opposite end to the measurement tip 120 or the free end, the cantilever 110 has a securing region 130. With the aid of the securing region 130, the probe 100 is incorporated into a measuring head of a scanning probe microscope (not illustrated in FIG. 1).

The probe 100 can be moved by way of a movement of the securing region 130. In particular, the cantilever 110 can be excited to oscillate. Furthermore, the cantilever 110 can comprise a piezo element that can excite the cantilever 110 to oscillate for example at the resonant frequency of the probe 100 (likewise not reproduced in FIG. 1). Furthermore, it is possible, if the cantilever 110 of the probe 100 is configured as a bimetal or bimetallic strip, for the probe 100 or the cantilever 110 thereof, with the aid of a laser beam, to be bent or to be excited to oscillate in the direction of the surface of a photolithographic mask. The probe 100 comprises a cantilever 110 in the form of a bending beam. It is not necessary, however, for use in an apparatus according to the invention. Rather, the probe 100 can comprise for example a V-shaped cantilever (not illustrated in FIG. 1).

The middle subfigure in FIG. 1 presents a second example of a probe 150. Unlike the probe 100, the probe 150 has a tip 160 in the form of a rectangular structure 165 arranged substantially in the direction of the sample normal to the longitudinal side of the cantilever 110. The rectangular structure 165 and the cantilever 110 of the probe 150 can be configured in an integral fashion or be produced as separate units and be joined together in a subsequent process step, for example by adhesive bonding. The rectangular structure can be produced from a metal such as, for instance, ruthenium, a semiconductor, for instance silicon, or an electrical insulator, for example silicon nitride. The measurement tip 160 of the probe 150 is suitable for displacing excess material and/or for processing a sample or a mask. Tips 160 which are not optimized for analyzing a sample surface and/or excess material are likewise referred to as measurement tips hereinafter.

Optimizing the probe 150 for displacing excess material also comprises adapting the cantilever 110 of the probe 150 to the movement or displacement of excess material. A stiff cantilever 110, i.e. a cantilever 110 having a high spring constant, fosters the displacement of excess material with the aid of the probe 150. Furthermore, it can be expedient to embody the cantilever 110 of the probe 150 as a V-shaped cantilever (not shown in FIG. 1). V-shaped cantilevers avoid problems of torsion or twisting that can occur in the case of beam-type cantilevers, or that is to say V-shaped cantilevers can be subjected to torsion in a defined manner more simply than beam-type cantilevers.

Instead of a rectangular structure 165, the tip 160 can have a planar curved structure. A planar curved structure in the form of a circle segment is expedient, wherein the midpoint of the circle on which the circle segment lies is situated in front of the probe arrangement 200 (not shown in FIG. 1). Furthermore, it is advantageous if the tip 160 of the cantilever 110 of the probe 150 is configured in the form of a V-shaped structure, wherein the opening of the 'V' points in the direction in which the excess material is intended to be displaced (not illustrated in FIG. 1).

Measurement tips in the form of rectangular 165 or planar curved structures have the disadvantage that these measurement tips can be advantageously used only for displacing excess material in one direction. It is therefore often more expedient to use a round measurement tip and to optimize the movement path of the measurement tip in order to displace the excess material along a desired movement path.

That surface of the cantilever 110 of the probes 100 and 150 which is situated opposite the measurement tips 120 and 160 can be provided with a thin metallic reflection layer in order to increase the reflectivity of the surface of the cantilever 110 for a light beam that functions as a light pointer (not shown in FIG. 1).

The probe 100, 150 can comprise an actuator in the form of a piezo actuator (not illustrated in FIG. 1). The piezo actuator can deflect the probe 100, 150. In particular, the piezo actuator can bend the measurement tip 120, 160 in the direction of a sample surface. Furthermore, the piezo actuator can excite the cantilever 110 of the probes 100 and 150 to oscillate. Preferably, a piezo actuator excites the cantilever 110 at or close to a resonant frequency of the probe 100, 150. In a preferred alternative embodiment, a piezo actuator is fitted in the securing region 130 of the probes 100 and 150 and connects the probes 100 and 150 to a measuring head of a scanning probe microscope. In the embodiment mentioned last, the cantilever 110 can comprise a resistive element that is used for bending the cantilever 110 towards or away from the surface of the mask. If the cantilever 110 is configured as a bimetallic element, the bending or curving of the cantilever 110 can be carried out by irradiation with a laser beam.

The lower subfigure in FIG. 1 presents a probe 190 having a securing region 130 and a measurement tip 120. The cantilever 170 of the probe 190 comprises a layer structure composed of two or more layers having different coefficients of thermal expansion. Furthermore, the probe comprises a heating element 180 with electrical leads 185 and 187. The heating element 180 or the resistive element 180 in the form of a heating resistor is arranged asymmetrically relative to the longitudinal axis of the probe 190 on the cantilever 170 thereof. As already explained above, the torsion of a cantilever 110 embodied in the form of a bending beam is difficult to define. V-shaped cantilevers are better suited to specific torsion.

The x-axis of a coordinate system of the probe 190 is parallel to the longitudinal axis of the probe. The z-axis of the coordinate system points in the direction of the measurement tip 120. The y-axis of the coordinate system is perpendicular to the x-axis and the z-axis and points in a direction such that the coordinate system forms a right-handed coordinate system.

Asymmetrical heating of the cantilever 170 having the structure of a bimetallic element by the heating element 180 leads to torsion of the cantilever and thus to a deflection of the measurement tip 120 in the direction of the y-axis. As a result of a bending of the cantilever relative to the x-axis, for example with the aid of the piezo actuator described above, and/or a torsion of the cantilever 170 of the probe 190 in the y-direction, the probe 190 can be used for analyzing or localizing excess material that has been absorbed at locations that are difficult to access on a photolithographic mask with a high aspect ratio.

Instead of the heating element 180 illustrated in the lower subfigure in FIG. 1, the cantilever 170 can be subjected to torsion by asymmetrical irradiation of the cantilever 170 with respect to the longitudinal axis thereof (not reproduced in FIG. 1). Moreover, it is possible to fit the above-described piezo actuator in bipartite form or in asymmetrical form relative to the longitudinal axis of the cantilever 170 on the latter and thereby to initiate a combined bending and torsion of the cantilever 170.

Figure 2:
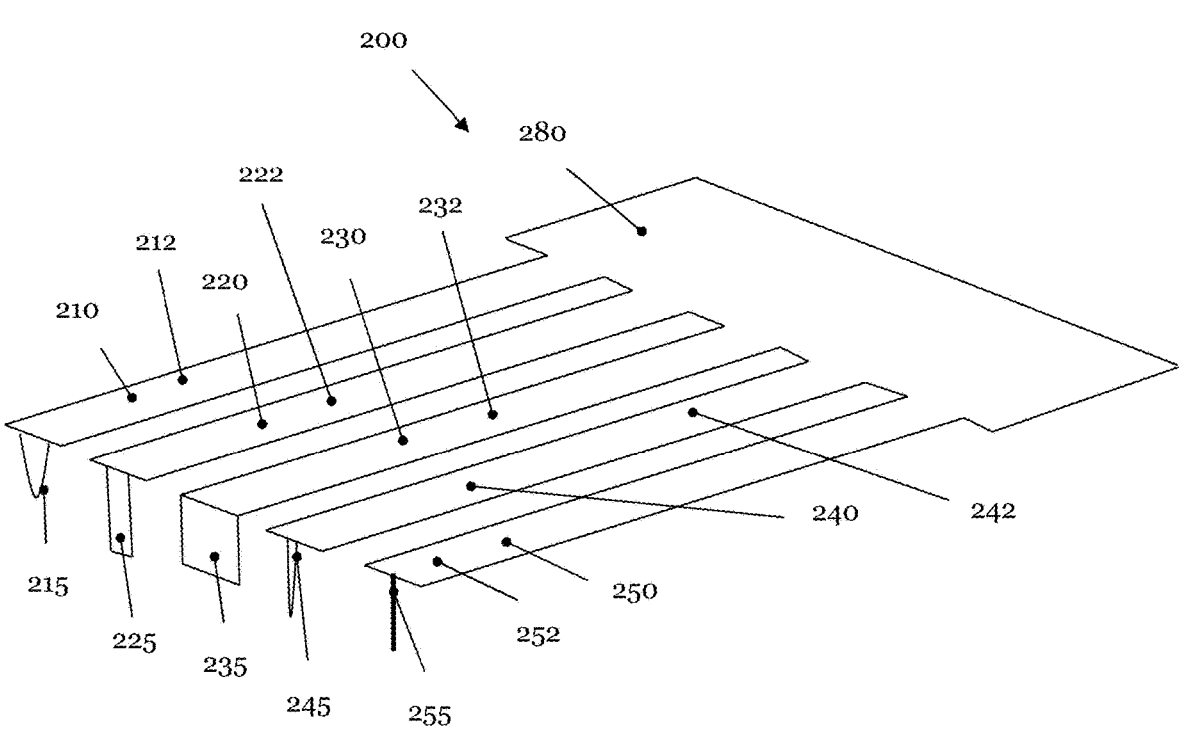
FIG. 2 schematically reproduces one exemplary probe arrangement of an SPM comprising five probes.

FIG. 2 shows one exemplary probe arrangement 200 comprising five individual probes 212, 222, 232, 242 and 252, which are held by a common securing region 280. With the aid of the securing region 280, the probe arrangement 200 is incorporated into a measuring head of an SPM. The cantilevers 210, 220, 230, 240 and 250 of the probe array 200 bear the measurement tips 215, 225, 235, 245 and 255. The measurement tips 215, 225, 235, 245 and 255 can be used for analyzing the mask and/or the excess material, for displacing the excess material and/or processing the sample or the photomask. The measurement tip 215 of the cantilever 210 of the probe arrangement 200 has a shape designed for implementing a processing function on a sample. Processing a photolithographic mask can comprise removing absorbing material from a photomask, said material being present in the form of a dark defect. Furthermore, processing a photolithographic mask using the measurement tip 215 can comprise removing one or more parts of a pattern element in order to create space for depositing or disposing of excess material present on a mask. Moreover, processing a mask using the measurement tip 215 of the cantilever 210 can comprise removing a first temporary auxiliary structure and/or removing a second temporary auxiliary structure.

The measurement tips 225 and 235 of the cantilevers 220 and 230 of the probe arrangement 200 are designed to displace excess material in a defined manner on the surface of a photolithographic mask. For this task, the tips 225 and 235 of the cantilevers 220 and 230 have a planar structure preferably in the form of a rectangular, a square, a V-shaped structure or a geometry of a circle segment. When displacing excess material with the aid of a thin measurement tip 245 or 255, there is the risk of the excess material evading the tip and thus escaping further movement by the measurement tip 245 or 255. The evasion of the excess material can best be attained by a suitable positioning of the measurement tip 245 or 255 with respect to the excess material (cf. the patent specification U.S. Pat. No. 6,812,460 B1 cited in the introductory part). By carrying out a meandering or circular movement of the measurement tip 245 or 255 around the desired displacement direction, the probability of losing the excess material during a displacement process is significantly reduced.

Furthermore, the planar tips 225 and 235 increase the probability that the probe 150 or the probe arrangement 200 can shift excess material in front of it in rectilinear movement, without losing the excess material during a movement process as a result of evasion.

Moreover, the measurement tips 225 and 235 of the cantilevers 220 and 230 can be used for specific processing purposes. By way of example, the tips can be used for comminuting excess material and/or for at least partly removing the first and the second temporary auxiliary structure.

Since, during displacement and/or during processing of a photomask, the tips 215, 225 and 235 generally make direct contact with the excess material to be displaced, the mask surface and/or the mask material to be processed, it can be advantageous to make their surfaces harder than the excess material and/or than the surface of the photolithographic mask in order to ensure an economic lifetime of the processing tips 215, 225 and 235 or the displacement tips 225 and 235. This objective can be achieved by the use of tips composed of hard material such as, for instance, silicon nitride and/or a corresponding tempering layer.

As already explained in the context of the discussion of FIG. 1, it is advantageous, besides the measurement tip 215, 225 and 235, also to adapt the cantilevers 210, 220 and 230 thereof to the specific task(s) of the measurement tips 215, 225 and 235. This can be done, in particular, by the spring constant of the cantilevers 210, 220 and 230 being greater than that of the cantilevers 240 and 250.

The measurement tip 245 of the cantilever 240 of the probe 242 of the probe arrangement 200 comprises a long thin tip having a small radius of curvature. This measurement tip 245 is designed for accurately examining a sample surface and for localizing and analyzing excess material.

The cantilever 250 of the probe 252 of the probe array 200 bears a long acicular tip 255. By way of example, a carbon nanotube can be used for said acicular tip 255. It is thus possible to scan regions of the surface of a sample which have a very high aspect ratio, i.e. a ratio of the depth or height of a structure to the smallest lateral extent thereof. With the aid of the probe 252, it is possible to detect excess material at locations of a photolithographic mask that are difficult to access.

The probe array 200 or the probe arrangement comprises five probes merely by chance in the example in FIG. 2. The minimum number of probes of a probe arrangement is two. If the probe arrangement comprises two measurement tips, typically one probe is designed for analyzing the mask and/or the excess material and the other probe is designed for displacing excess material on the mask. The number of probes of a probe arrangement 200 is upwardly limited by the number of probes that can be fabricated in an MMS (micromechanical system).

In the example illustrated in FIG. 2, the cantilevers 210, 220, 230, 240 and 250 have a width of 5 μm to 100 μm. Their length is in the range of 5 μm to 500 μm. The distance between adjacent cantilevers is in the range of 1 μm to 100 μm.

Figure 3A:
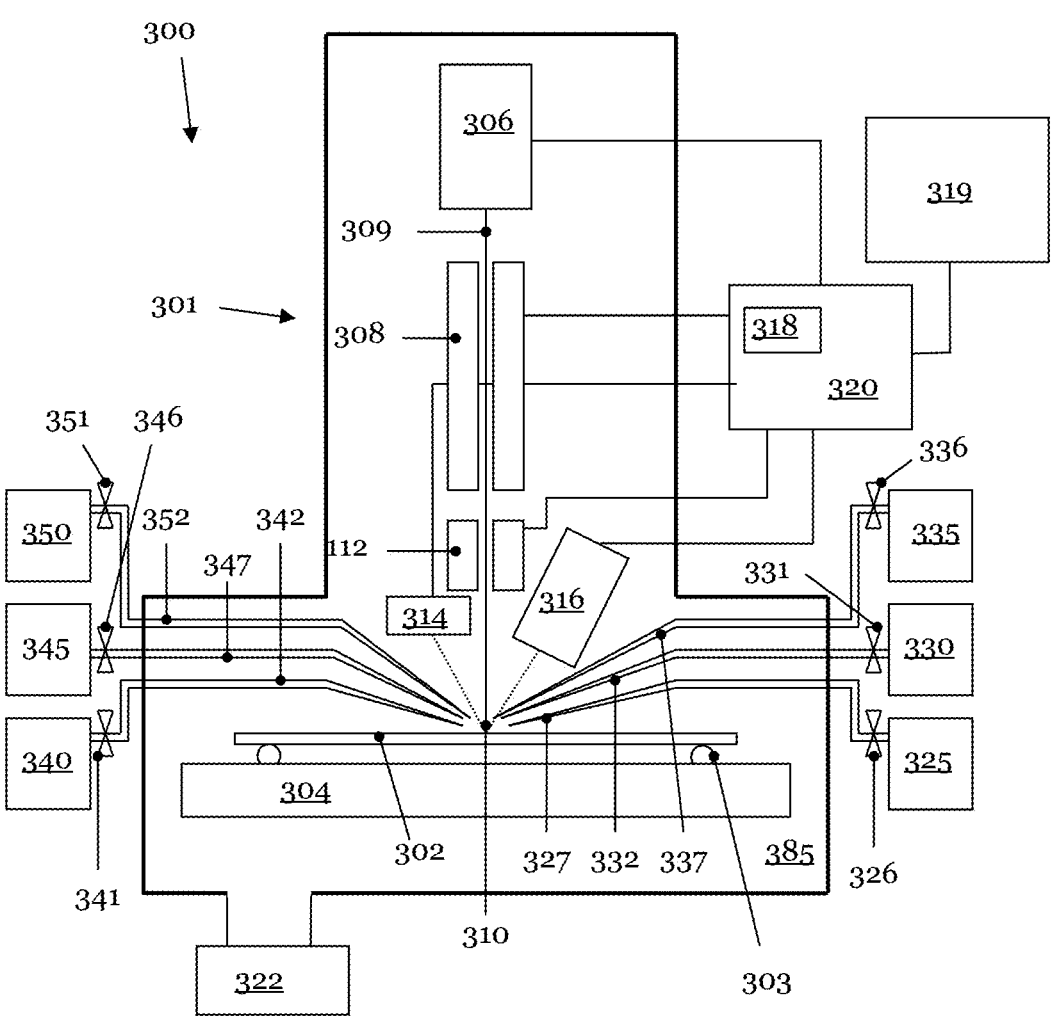
FIG. 3A illustrates a section through a schematic block diagram of some important components of an apparatus which can be used for displacing excess material and for fixing the displaced excess material on a photolithographic mask.
Figure 3B:
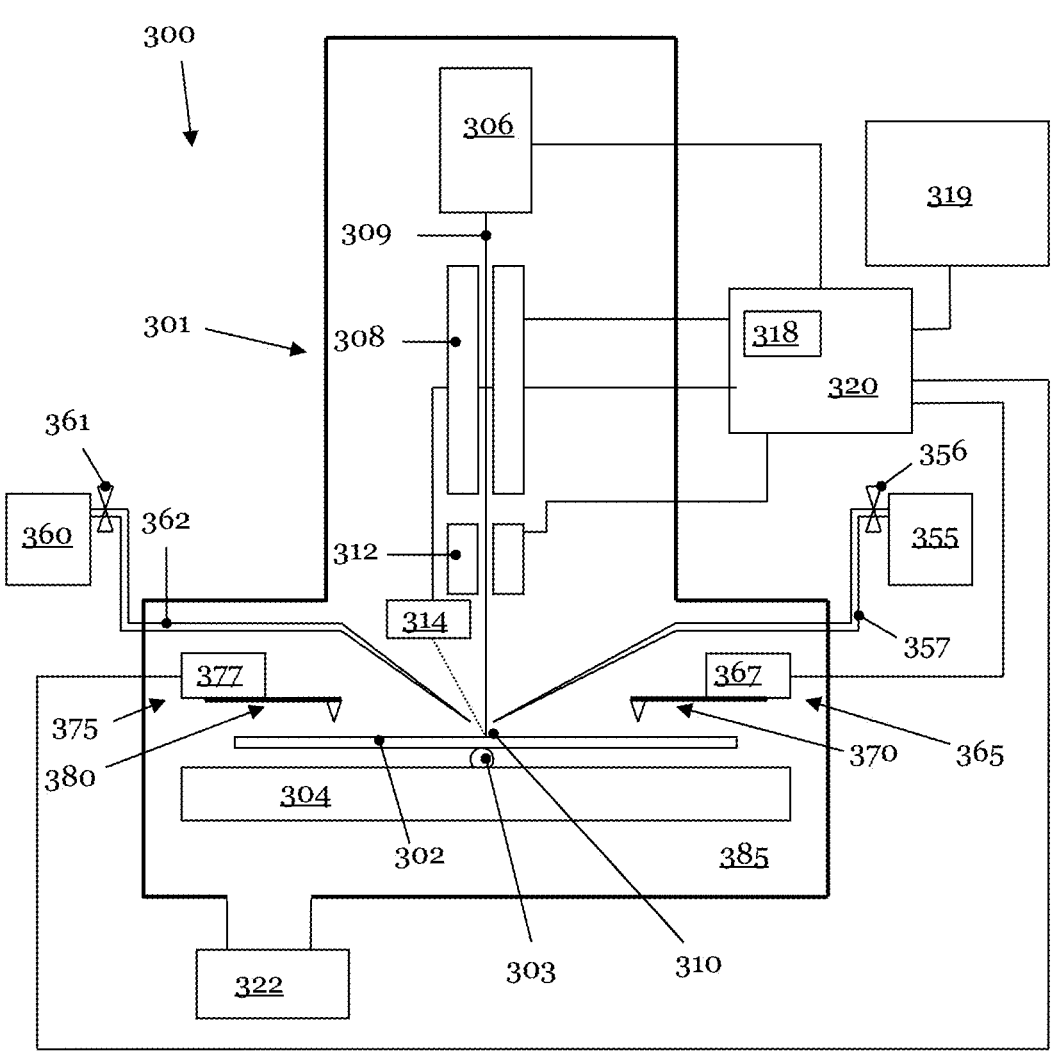
FIG. 3B shows a section through the apparatus from FIG. 3A in which the sectional plane is rotated by 90° relative to FIG. 3A.

FIG. 3A schematically shows a section through essential components of an apparatus 300 that can be used for displacing excess material on a sample 302, for example a photolithographic mask 302. FIGS. 3A and 3B should be seen as interrelated. FIG. 3B presents a section through essential components of the apparatus 300 from FIG. 3A, in which the sectional plane is rotated by 90° relative to FIG. 3A.

The sample 302 can be an arbitrary micro- or nanostructured component or component from the field of microelectronics or nanotechnology. Preferably, the sample 302 comprises a transmissive or a reflective photomask and/or a template for nanoimprint technology. Besides the processing of photomasks, the apparatus 300 can also be used for processing for example an integrated circuit, a microelectromechanical system (MEMS) and/or a photonic integrated circuit which have excess material at locations that are difficult to access. In the examples explained below, the sample 302 is a photolithographic mask 302.

The exemplary apparatus 300 in FIG. 3 is a modified scanning electron microscope (SEM) 301 comprising two scanning probe microscopes 365 and 375 in the form of atomic force microscopes. An electron gun 306 generates an electron beam 309, which is directed by the elements 308 and 312 as a focused electron beam 310 onto the photolithographic mask 302 arranged on a sample stage 304 (or stage) in a three-point bearing arrangement 303.

The sample stage 304 comprises adjusting devices (not shown in FIG. 3) with the aid of which that location of the photomask 304 which has excess material can be brought beneath the point of incidence of the electron beam 310 on the photomask 304 and/or into the processing region of the AFMs 365 and 375. In addition, the sample stage 304 can be displaced in height, i.e. in the z-direction or in the beam direction of the electron beam 309, such that the focus of the electron beam 310 becomes located on the surface of the photomask 304 (likewise not illustrated in FIG. 3). Furthermore, the sample stage 304 can comprise an apparatus for setting and controlling the temperature, which makes it possible to bring the photomask 304 to a predefined temperature and to keep it at this temperature (not indicated in FIG. 3).

The apparatus 300 in FIG. 3 uses an electron beam 309 as energy source for initiating a local chemical reaction of a deposition gas and/or an etching gas. An electron beam 310 can be focused onto a small focal spot having a diameter of <10 nm. In addition, electrons that are incident on the surface of the photomask 304 cause hardly any damage to the photomask 304, even if their kinetic energy varies over a large energy range. However, the apparatus 300 and the method presented here are not restricted to the use of an electron beam 309. Rather, any desired particle beam can be used which is able to bring about locally a chemical reaction of a deposition gas and/or an etching gas at the point of incidence of the particle beam on the surface of the photomask 304. Examples of alternative particle beams are an ion beam, atomic beam, molecular beam and/or photon beam. Furthermore, it is possible to use two or more particle beams in parallel. In particular, it is possible simultaneously to use an electron beam 309 and a photon beam as energy source (not shown in FIG. 3).

The electron beam 309 can be used for recording an image of the photomask 304, in particular of that region of the photomask 304 which contains excess material. The electron beam 309 can thus be used for localizing and for examining excess material. A detector 314 for detecting backscattered electrons and/or secondary electrons supplies a signal that is proportional to the surface contour of the excess material and/or to the composition of the photomask 304 or of the excess material.

By scanning or raster-scanning the focused electron beam 310 over the photomask 302 with the aid of a control unit 318, a computer system 320 of the apparatus 300 can generate an image of the photomask 302 or the excess material. The control unit 318 can be part of the computer system 320, as illustrated in FIG. 3, or can be embodied as a separate unit (not illustrated in FIG. 3). The computer system 320 can comprise algorithms which are realized in hardware, software, firmware or a combination thereof and which make it possible to extract an image from the measurement data of the detector 314. A screen 319 of the computer system 320 can display the calculated image. Furthermore, the computer system 320 can store the measurement data of the detector 314 and/or the calculated image of the excess material. Furthermore, the control unit 318 of the computer system 320 can control the electron gun 306 and the beam-imaging and beam-shaping elements 308 and 312. Control signals of the control unit 318 can furthermore control the movement of the sample stage 304 by use of adjusting devices (not indicated in FIG. 3).

The electron beam 310 incident on the photomask 302 can electrostatically charge the photomask 302. As a result, the electron beam 310 can be deflected and the spatial resolution when localizing the excess material and that region of the photomask 302 which surrounds the excess material can be reduced. In order to reduce an electrostatic charging of the photomask 302, an ion gun 316 can be used to irradiate the surface of the photomask 302 with ions having low kinetic energy. By way of example, it is possible to use argon ions having a kinetic energy of a few 100 eV for neutralizing the photomask 302. In an alternative embodiment or in addition to the apparatus 300 described, a shielding grid can be fitted at the output of the scanning electron microscope, said shielding grid largely preventing a reduction of the spatial resolution of the electron beam 309 by an electrostatic charging of the photomask 302.

In order to dispose of the excess material of the photomask 302 arranged on the sample stage 304, the exemplary apparatus 300 in FIGS. 3A and 3B comprises eight supply containers for eight different processing gases or precursor gases. The first supply container 325 stores a first deposition gas, in particular a first carbon-containing deposition gas. By way of example, a carbon-supplying precursor gas such as, for instance, one of the alkanes dodecane ($C_{12}H_{26}$) to octadecane ($C_{18}H_{38}$) can be stored in the first supply container 325. The first deposition gas can be used to deposit a first temporary auxiliary structure on the photolithographic mask 302 with the aid of the electron beam 309.

The second supply container 330 stores a second deposition gas. The second deposition gas can comprise for example a second carbon-containing deposition gas, for example a metal carbonyl, such as, for instance, tungsten hexacarbonyl ($W(CO)_6$). The second deposition gas is preferably used to deposit a second temporary auxiliary structure on a transmissive or a reflective region of the photomask 302. In another embodiment, the second deposition gas can comprise one of the alkanes introduced in the previous section.

A third deposition gas is stored in the third supply container 335. The third deposition gas can comprise a metal carbonyl, for instance chromium hexacarbonyl ($Cr(CO)_6$). The third deposition gas is typically used to replace absent parts of a pattern element of the photomask 302.

The fourth supply container 340 stores a fourth deposition gas, for example a metal halide, such as, for instance, titanium tetrachloride ($TiCl_4$). The fourth deposition gas is used to deposit additional material on the displaced excess material. As a result, the surface area of the displaced excess material is enlarged, which increases the area of application of a flowing cleaning fluid in a cleaning process.

In one exemplary embodiment, the first, the second and the fourth deposition gas are identical and for example one of the alkanes described above.

A fifth supply container 345 stores a first etching gas. The first etching gas can comprise one of the etching gases mentioned above, such as, for instance, water ($H_2O$).

A second etching gas is stored in a sixth supply container 350. The second etching gas can comprise for example a nitrogen oxide ($N_2O$, NO, $NO_2$).

A combination of the first and the second etching gas is preferably used to remove the first temporary auxiliary structure again from the photolithographic mask 302 after displacing the excess material onto a pattern element of the photomask 302 and fixing the displaced excess material. Furthermore, a combination of the first and the second etching gas is typically used for removing the second temporary auxiliary structure together with the excess material situated on the second auxiliary structure in a local EBIE (Electron Beam Induced Etching) process in combination with the electron beam 309. Furthermore, it is conceivable to combine the first and the second etching gas such that the first and/or the second temporary auxiliary structure are/is etched without the provision of the electron beam 309, i.e. spontaneously.

A seventh supply container 355 stores a third etching gas. The third etching gas can comprise one from the list of etching gases indicated above, for example xenon difluoride ($XeF_2$). The third etching gas is preferably used during the removal of a part of a pattern element of the photomask 302.

Finally, the eighth supply container 360 stores an additive gas. The additive gas can comprise an additional oxidant, for example an element from the group: oxygen ($O_2$), ozone ($O_3$), water ($H_2O$), heavy water ($D_2O$), hydrogen peroxide ($H_2O_2$), dinitrogen monoxide ($N_2O$), nitrogen monoxide (NO), nitrogen dioxide ($NO_2$), nitric acid ($HNO_3$) and other oxygen-containing compounds. In a second embodiment, the additive gas comprises a gas having a reducing effect, such as, for instance, hydrogen ($H_2$) or ammonia ($NH_3$).

An additive gas can be used to increase the metal proportion of the deposit when depositing absorbing material for repairing a pattern element of the photomask 302. Furthermore, it is possible to use an additive gas in the form of an oxidant or a reducing agent in order to increase the selectivity during the etching of the first and/or the second temporary auxiliary structure and during the partial removal of a pattern element.

Each supply container 325, 330, 335, 340, 345, 350, 355, 360 has its own control valve 326, 331, 336, 341, 346, 351, 356, 361, in order to supervise or control the absolute value of the corresponding gas that is provided per unit time, i.e. the gas volumetric flow rate at the location of the incidence of the electron beam 310. The control valves 326, 331, 336, 341, 346, 351, 356, 361 are controlled and supervised by the control unit 318 of the computer system 320. The partial pressure ratios of the gases provided at the processing site can thus be set in a wide range.

Furthermore, in the exemplary apparatus 300 each supply container 325, 330, 335, 340, 345, 350, 355, 360 has its own gas feed line system 327, 332, 337, 342, 347, 352, 357, 362, which ends with a nozzle in the vicinity of the point of incidence of the electron beam 310 on the photomask 302. In an alternative embodiment (not represented in FIG. 3), a gas feed line system in the form of a mixing tube is used to bring a plurality or all of the processing gases in a common stream onto the surface of the sample 302.

In the example illustrated in FIG. 3, the valves 326, 331, 336, 341, 346, 351, 356, 361 are arranged in the vicinity of the corresponding containers 325, 330, 335, 340, 345, 350, 355, 360. In an alternative arrangement, the control valves can be incorporated in the vicinity of the corresponding nozzles (not shown in FIG. 3). Unlike the illustration shown in FIG. 3 and without preference at the present time, it is also possible to provide one or a plurality of the gases stored in the containers 325, 330, 335, 340, 345, 350, 355, 360 non-directionally in the lower part of the vacuum chamber 385 of the apparatus 300. In this case, it is necessary for the apparatus 300 to incorporate a stop (not illustrated in FIG. 3) between the lower reaction space and the upper part of the device 300, which provides the electron beam 309, in order to prevent an excessively low vacuum in the upper part of the apparatus 300.

Each of the supply containers 325, 330, 335, 340, 345, 350, 355, 360 may have its own temperature setting element and control element that enables both cooling and heating of the corresponding supply containers. This makes it possible to store and provide the deposition gases, the etching gases and/or the additive gas at the respectively optimum temperature (not shown in FIG. 3). Furthermore, each feeder system 327, 332, 337, 342, 347, 352, 357, 362 may comprise its own temperature setting element and temperature control element in order to provide all the process gases at their optimum processing temperature at the point of incidence of the electron beam 310 on the photomask 302 (likewise not indicated in FIG. 3). The control unit 318 of the computer system 320 can control the temperature setting elements and the temperature control elements both of the supply containers 325, 330, 335, 340, 345, 350, 355, 360 and of the gas feed line systems 327, 332, 337, 342, 347, 352, 357, 362. The supply containers 325, 330, 335, 340, 345, 350, 355, 360 can be embodied in the form of gas cylinders. The control valves 326, 331, 336, 341, 346, 351, 356, 361 can be realized as flow regulators.

The apparatus 300 in FIG. 3 comprises a pump system 322 for generating and maintaining a vacuum required in the vacuum chamber 385. With closed control valves 326, 331, 336, 341, 346, 351, 356, 361 a residual gas pressure of $\leq 10^{-7}$ mbar is achieved in the vacuum chamber 385 of the apparatus 300. The pump system 322 may comprise separate pump systems for the upper part of the apparatus 300 for providing the electron beam 309, and the lower part 395 comprising the sample stage 304 with the photomask 302.

Finally, the exemplary apparatus 300 comprises two atomic force microscopes 365 and 375. The probes 370 and 380 thereof are incorporated into the apparatus 300 at the measuring heads 367 and 372. The AFMs 365 and 375 are controlled by the control unit 318 of the computer system 320. The probes 370 and 380 of the AFMs 365 and 375 can use one of the probes 100, 150 or 190 from FIG. 1 or the exemplary probe arrangement 200 from FIG. 2. For carrying out a method according to the invention, it is not necessary for the apparatus 300 to comprise two scanning probe microscopes. One scanning probe microscope is sufficient for displacing excess material on a sample surface (not illustrated in FIG. 3).

Figure 4:
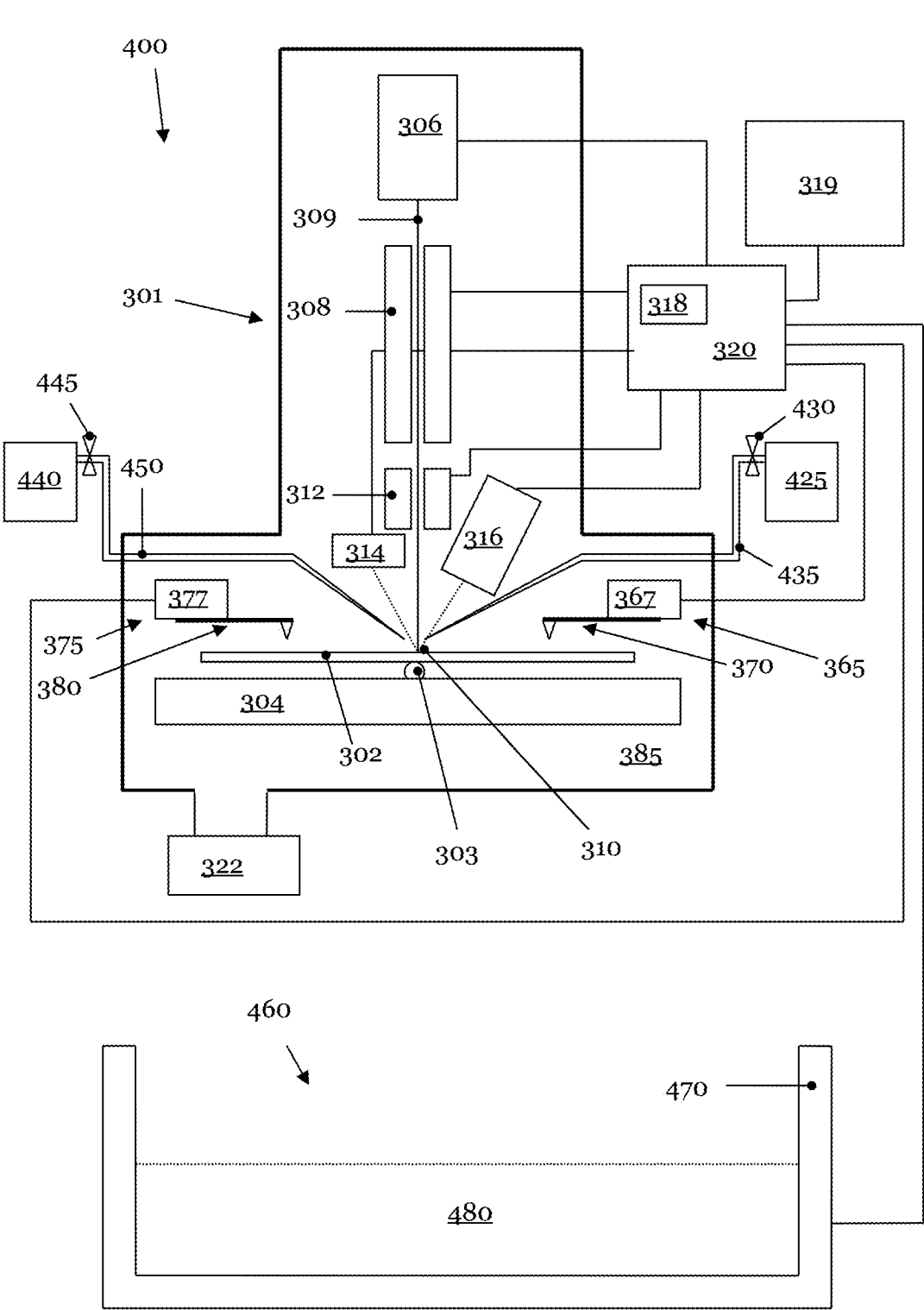
FIG. 4 presents a section through a schematic block diagram of some important components of an apparatus which can be used for displacing excess material and for removing the displaced excess material from a photolithographic mask.

The apparatus 400 in FIG. 4 shows a second exemplary embodiment of an apparatus according to the invention. The apparatus 400 comprises the SEM 301 and the AFMs 365 and 375 from FIGS. 3A and 3B and also a cleaning apparatus 460. The components of the apparatus 300 that have been explained in the context of FIGS. 3A and 3B will no longer be discussed hereinafter. Rather, some of the differences between the apparatuses 300 and 400 will be discussed and the additional components of the apparatus 400 will be described. Unlike the apparatus 300, the apparatus 400 comprises only two supply containers 425 and 440 for storing two precursor gases. By way of example, the supply container 425 stores one of the deposition gases indicated above, and the supply container 440 stores one of the etching gases mentioned above. It is also possible for the supply container 425 to store a mixture of two or more deposition gases, and for the supply container 440 to store a mixture of two or more etching gases. The flow of the deposition gas(es) is controlled by the control valve 430 and the deposition gas is provided at the deposition site with the aid of the gas feed line system 435. The flow of the etching gas(es) of the container 440 is likewise controlled by the control valve 445 and delivered locally at the site of the EBIE process by use of the gas feed line system 450.

The cleaning apparatus 460 of the apparatus 400 in FIG. 4 comprises a cleaning container 470 containing a cleaning liquid 480. The cleaning container 470 can contain an ultrasonic source, by which the cleaning liquid 480 can be transformed into an ultrasonic bath. The cleaning liquid 480 comprises a liquid used in conventional mask cleaning processes, such as, for instance, a solution of sulfuric acid and hydrogen peroxide ($H_2SO_4$—$H_2O_2$ (4:1), called "Piranha clean") or a mixture of water, hydrogen peroxide and ammonium hydroxide ($H_2O$—$H_2O_2$—$NH_4OH$ (5:1:1), called SC1 (standard clean)).

Figure 5:
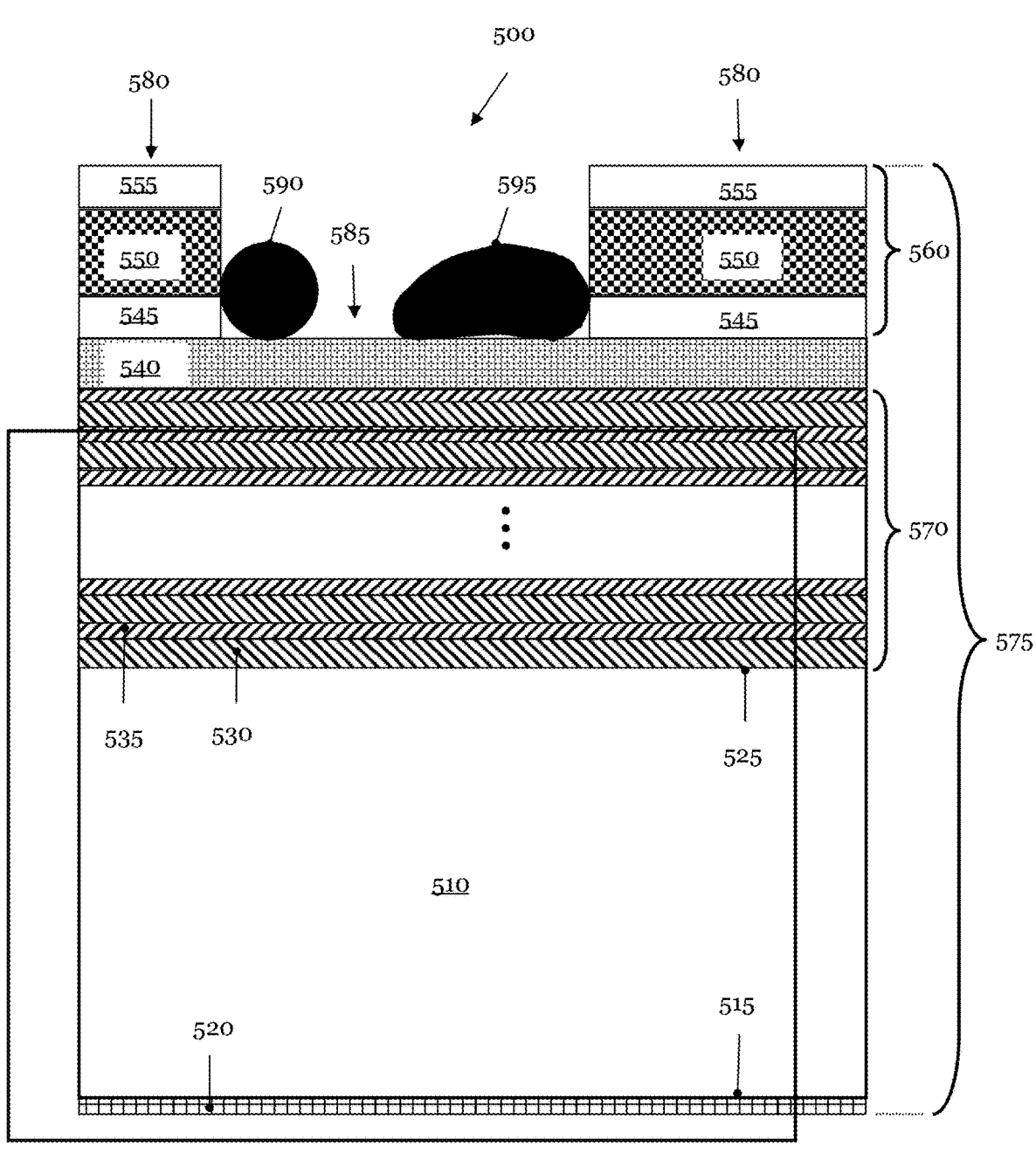
FIG. 5 reproduces a schematic illustration of a section through a photomask for the extreme ultraviolet (EUV) wavelength range, wherein the cover layer of the EUV mask has excess material in the form of two particles.

FIG. 5 schematically presents a section through a reflective photolithographic mask 500 for the EUV wavelength range. A photolithographic mask for the EUV wavelength range is also referred to below as EUV mask or EUV photomask. The exemplary EUV mask 500 is designed for an exposure wavelength in the region of 13.5 nm. The EUV mask 500 has a substrate 510 made of a material with a low coefficient of thermal expansion, such as quartz, for example. Other dielectrics, glass materials or semiconducting materials likewise can be used as substrates for EUV masks, such as ZERODTJIR®, ULE® or CLEARCE-RAM®, for instance. The rear side 515 or the rear-side surface 515 of the substrate 510 of the EUV mask 500 serves to hold the substrate 510 during the production of the EUV mask 500 and during the operation thereof in an EUV photolithography apparatus. Preferably, a thin electrically conductive layer 520 for holding the substrate 510 on an electrostatic chuck (ESC) is applied to the rear side 515 of the substrate 510. (The chuck is not illustrated in FIG. 5.)

A multilayer film or a multilayer structure 570 comprising 20 to 80 pairs of alternating molybdenum (Mo) 530 and silicon (Si) layers 535, which are also referred to as MoSi layers, is deposited onto the front side 525 of the substrate 510. In order to protect the multilayer structure 570, a capping layer 540 made of silicon dioxide, for example, is applied on the topmost silicon layer 535. Other materials such as ruthenium (Ru), for example, can likewise be used for forming a capping layer 540. Instead of molybdenum, it is also possible to use layers composed of other elements having a high mass number, such as e.g. cobalt (Co), nickel (Ni), tungsten (W), rhenium (Re), zirconium (Zn) or iridium (Ir), for the MoSi layers.

In order to produce an EUV mask 500 from a mask blank 575, a buffer layer 545 is deposited on the capping layer 540. Possible buffer layer materials are quartz ($SiO_2$), silicon oxygen nitride (SiON), Ru, chromium (Cr) and/or chromium nitride (CrN). An absorption layer 550 is deposited on the buffer layer 545. Materials suitable for the absorption layer 550 are, inter alia, Cr, titanium nitride (TiN) and/or tantalum nitride (TaN). An antireflection layer 555, for example made of tantalum oxynitride (TaON), can be applied on the absorption layer 550. Accordingly, the term mask blank 575 denotes the entire layer sequence of an EUV mask 500, without a structuring of the absorption layer 550, of the buffer layer 545 and of the antireflection layer 555 possibly present.

The absorption layer 550 is structured, with the aid of a photoresist and an electron beam or a laser beam, for example, such that a structure of absorbing pattern elements 560 is produced from the whole-area absorption layer 550. The buffer layer 545 serves to protect the multilayer structure 570 when structuring the absorption layer 550, i.e. when producing the pattern elements 560. The EUV mask 500 thus has absorbing regions 580 and reflective regions 585.

In the exemplary EUV mask 500 illustrated in FIG. 5, excess material in the form of two particles 590 and 595 is situated on the capping layer 540 of the multilayer structure 570. The particle 590 has a substantially spherical shape, whereas the particle 595 has a potato-like surface contour. The particles 590 and 595 can be dust or dirt particles from the ambient air that have settled on the capping layer 540 of the EUV mask 500. It is also possible for the excess material of the particles 590 and/or 595 to originate from a repair of the EUV mask 500. The particles 590, 595 typically have dimensions ranging from a few nanometers to the upper two-digit nanometers range.

The particles 590 and 595 absorb photons at the actinic wavelength and thereby disturb the reflection of EUV photons from the reflective region 585 and therefore lead to printable defects of the EUV mask 500. It is accordingly necessary to remove the particles 590 and 595 from the capping layer 540 of the multilayer structure 570 of the EUV mask 500. The same applies to particles that have adsorbed on the substrate of a transmissive photomask and reach a minimum size depending on the actinic wavelength of the mask. Printable defects of an EUV mask 500 are defects which are transferred to a wafer during an exposure process of the EUV mask 500 via the photoresist arranged on the wafer and lead to detectable deviations of the structure elements transferred to the wafer with respect to the structure elements predefined by the design of the wafer.

Figure 6:
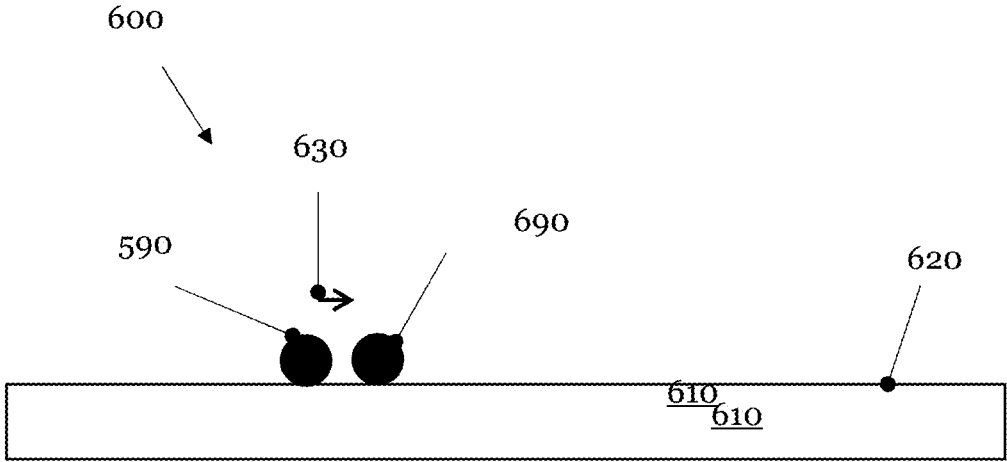
FIG. 6 presents a first exemplary embodiment for removing excess material from a transmissive or a reflective region of a photomask.

The diagram 600 in FIG. 6 illustrates a first example of removing excess material 590, 595 from a photomask. The particle 590 is situated on surface 620 of a transmissive or reflective layer 610 of a photomask. In the case of a reflective photomask, the layer 610 can be the capping layer 540 of the EUV mask 500. In the case of a transmissive mask, the layer 610 can comprise the substrate of the mask. In some cases, the particle 590 has got caught on the surface 620 of the transmissive or the reflective layer 610, such that a cleaning process cannot overcome the adhesion force between the particle 590 and the layer 610 and therefore cannot remove the particle 590 from the surface 620 of the layer 610. Releasing the anchoring of the particle 590 significantly reduces the adhesion force thereof to the surface 620 of the layer 610, such that said particle can be removed from the layer 610 in a subsequent cleaning process. This applies in particular to relatively large particles. Relatively large particles have dimensions of more than 50 nm.

Excess material 590, 595 in the form of small particles poses a greater problem, however. Small particles are identified by dimensions of less than 30 nm. Small particles are subject to strong attraction by the sample surface on account of the van der Waals interaction and have a small surface area. Therefore, excess material 590, 595 in the form of small particles can be removed from a photomask only with difficulty by normal cleaning methods.

By means of direct contact of one of the probes from FIG. 1 or one of the probes of the probe arrangement 200 with the exception of the probe 252 of one of the AFMs 365 and 375, a relatively large particle can be released from its anchoring on the surface 620 of the layer 610. The probes 100, 150, 190 from FIG. 1 and the probes 212, 222, 232 and 242 of the probe arrangement 200 can be used for this movement process of the relatively large particle since a short jerky movement of the relatively large particle is normally sufficient to release the catching. Advantageously, the probe 150 having the tip 160 from FIG. 1 or the probes 222, 232 having the tips 225, 235 is/are used for this task. The movement process of the relatively large particle is indicated by the arrow 630 in FIG. 6. Releasing the anchoring of the relatively large particle significantly reduces the adhesion force thereof to the surface 620 of the layer 610, such that said particle can be removed from the layer 610 in a subsequent cleaning process that is carried out with the aid of the cleaning apparatus 460.

A second exemplary embodiment for removing excess material from a mask surface 620 is illustrated in the diagram 700. As is indicated schematically by the group of arrows 750 in the left-hand part of the diagram 700, the flow velocity of a cleaning fluid decreases with decreasing distance from the surface. In particular small particles, such as the particle 590, for instance, have a small cross-sectional area and flow impinges on them only at low velocity during a cleaning process, for example in a washing process. If the force of the flow resistance of the particle 590 is lower than the adhesion force thereof to the surface 620 of the layer 610, said particle cannot be moved by the cleaning process.

Figure 7:
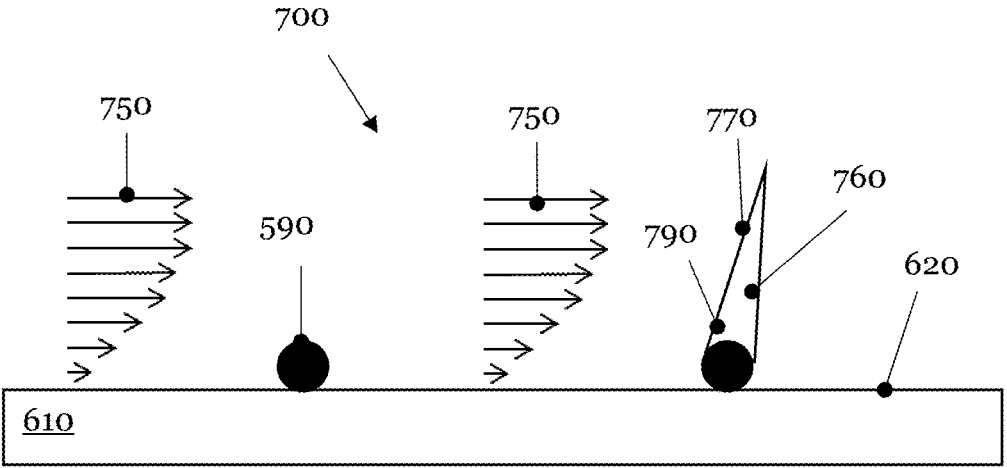
FIG. 7 illustrates a second exemplary embodiment for removing excess material from a transmissive or a reflective region of a photomask.

The surface area of the particle 590 can be enlarged in a targeted manner with the aid of a particle beam-induced deposition process. The right-hand part of FIG. 7 shows the modified particle 790, which has an enlarged surface area 770 on account of the material 760 deposited on the particle 590. The enlarged surface area 770 of the modified particle 790 offers the flow profile 750 of a cleaning fluid a significantly enlarged area of application and the modified particle 790 can be removed from the surface 620 of the layer 610 of a photomask in a cleaning or washing process.

The apparatus 400 from FIG. 4 can be used for carrying out the method explained with reference to FIG. 7. The particle 590 can be transformed into the modified particle 790 by a nanostructuring of the particle 590 by use of an electron beam-based or electron beam-induced deposition process using the deposition gas stored in the container 425. The deposition gas used is preferably an alkane, for example dodecane ($C_{12}H_{26}$), a metal carbonyl, for instance chromium hexacarbonyl ($Cr(CO)_6$), and/or a metal halide, such as, for instance, tungsten hexachloride ($WCl_6$). Firstly, these deposits formed from an alkane, metal carbonyl or a metal halide adhere well to the particle 590 and, secondly, carbon, a metal carbonyl or a metal halide can be deposited over a small area on the particle 590.

Figure 8:
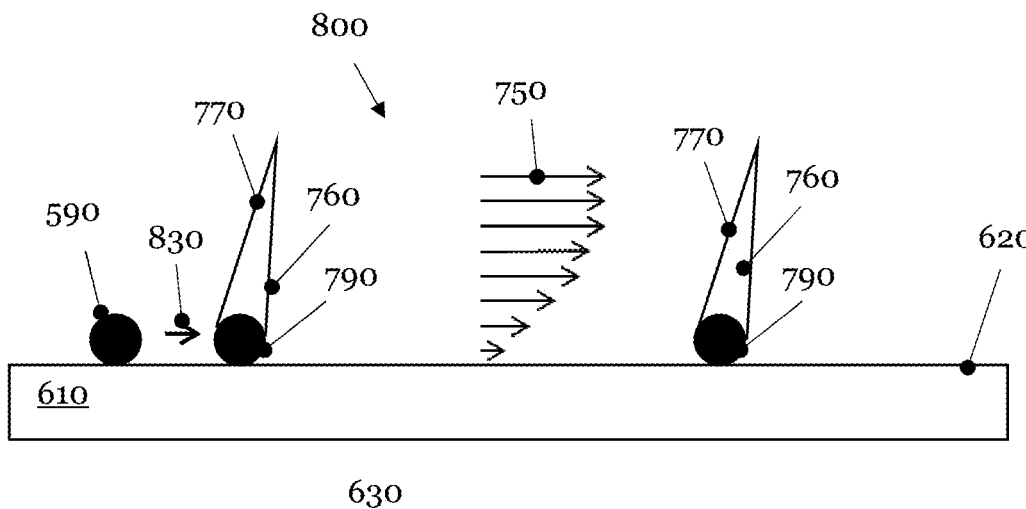
FIG. 8 illustrates a third exemplary embodiment for removing excess material from a transmissive or a reflective region of a photomask, which combines the processes from FIGS. 6 and 7.

The diagram 800 in FIG. 8 combines the two exemplary embodiments from FIGS. 6 and 7. In a first step, the particle 590 is torn from its anchoring by a jerky movement as a result of interaction with a probe of one of the AFMs 365 and 375. This movement process is symbolized by the arrow 830 in FIG. 8. In the second step, material 760 is deposited on the displaced particle in order to enlarge the surface area 770 thereof. Finally, the displaced and modified particle 790 is subjected to a cleaning process, wherein the cleaning fluid has the flow profile 750. The cleaning process removes the displaced and modified particle 790 from the surface 620 of the layer 610.

Figure 9:
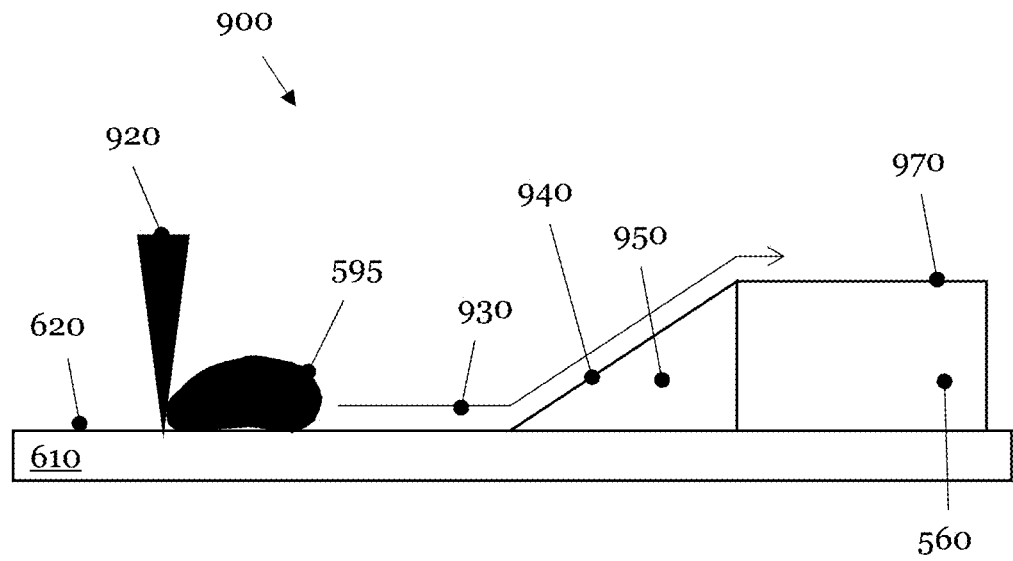
FIG. 9 schematically shows the displacement path of a particle of excess material from a transmissive or a reflective region of a photomask via a ramp onto a pattern element of the photomask.
Figure 10:
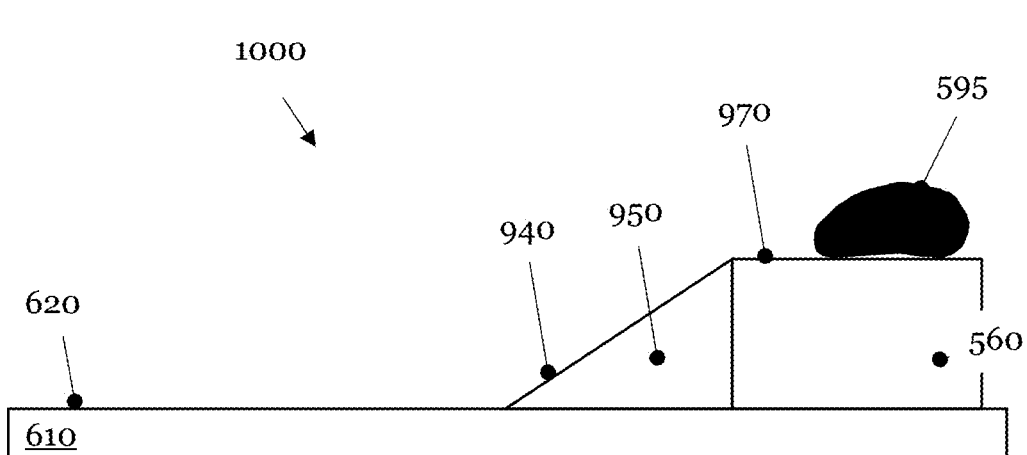
FIG. 10 illustrates FIG. 9 after performing the displacement process on the particle of excess material.
Figure 11:
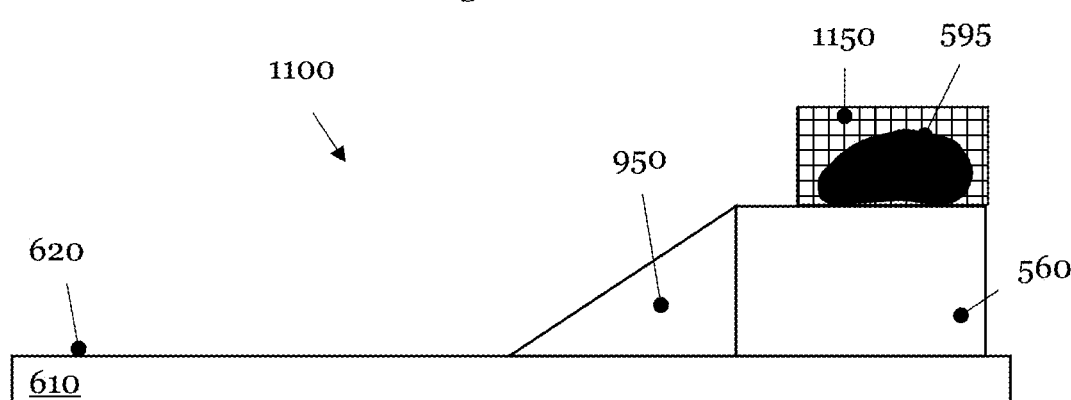
FIG. 11 illustrates FIG. 10 after fixing the particle on the pattern element of the mask.

The diagrams 900 to 1100 in FIGS. 9 to 11 present a fourth example for disposing of excess material 590, 595 present on a photomask. The exemplary embodiment illustrated in FIGS. 9 to 11 is preferably implemented by the apparatus 300. In a first step, the particle 595 is displaced from the transmissive or reflective surface 610 of a photomask, for example of the EUV mask 500 from FIG. 5, onto an absorbing pattern element 560 of the photomask. In modern photomasks, absorbing pattern elements 560 typically have a height of between 50 nm and 100 nm.

In order to overcome the height difference between the surface 610 and the surface 970 of the pattern element 560 by displacement with the aid of a probe 100, 150, 190 from FIG. 1 or a probe 212, 222, 232, 242 of the probe arrangement 200 from FIG. 2, therefore, a first temporary auxiliary structure 950 in the form of a ramp is deposited on the transmissive or reflective layer 610 of a photomask. The first temporary auxiliary structure 950 is deposited on the layer 610 of a photomask for example by providing a carbon-containing deposition gas stored in the first supply container 325 and the electron beam 310. When depositing the first temporary auxiliary structure 950, care is taken to ensure that the deposited material of the ramp 950 can be removed again from the layer 610 of the photomask in a simple manner. This is the case, for example, if the deposit of the ramp 950 has a large proportion of carbon and/or a large proportion of molybdenum. At the same time the deposit should be hard enough such that it is not appreciably damaged by the measurement tip. Moreover, it is expedient if the deposit has a low absorption coefficient with respect to the excess material 590, 595.

The gradient of the ramp 950 is adapted to the capabilities of the probe used for displacing the particle 595. The gradient of the ramp 950 is typically in an angular range of 5° to 40°. The first temporary auxiliary structure 950 need not have a linear ascent. Rather, the surface 940 of the ramp 950 can be embodied in curved form. Furthermore, it is not necessary for the first temporary auxiliary structure 950 to have a smooth surface 940. It is possible for the ramp 950 to have steps as long as the height thereof is smaller than the height over which a probe can convey the particle 595 in a displacement process.

The arrow 930 in FIG. 9 indicates the displacement path of the particle 595 from the transmissive or reflective layer 610 onto the absorbing pattern element 560. The length of displacement path 930 is typically in the two-digit nanometers range, but in extreme cases can extend to the low four-digit nanometers range. In order to displace the particle 595 via the ramp 950 onto the pattern element 560, it is expedient to use a probe optimized for a displacement process. This means that a probe having a planar tip is preferably used for the measurement tip 920 indicated in FIG. 9. In FIG. 1 this is the probe 150 having the planar tip 160, and in the probe arrangement 200 from FIG. 2 this is the probes 222 or 232 having the planar tips 225 or 235. In the case of a particle 595 that is not charged or not significantly charged, the tip 160, 225, 235 of the probe 150, 222, 232 contacts the particle 595 during the displacement process. A planar tip 160, 225, 235 largely prevents the particle 595 from tearing away laterally from the planned displacement path 930 and thereby escaping a further displacement by the tip 160, 225, 235 of the probe 150, 222, 232. In this case, it is expedient if the width of the planar tip 160, 225, 235 is larger than the largest of the dimensions of the particle 590, 595. The use of one of the probes 150, 222 or 232 enables a rectilinear displacement of the particle 595 along the path 930.

The probes 100 and respectively 190 from FIG. 1 and probes 212 and respectively 242 that are optimized for analysis or processing purposes can likewise be used for displacing the particle 595 along the path 930. In the case of a rectilinear movement of the probe 100, 170, 212 or 242, however, there is the risk of the particle 595 deviating from the predefined path 930 to the left or right, and thus of a further movement of the probe 100, 170, 212 or 242 along the path 930 not bringing about any further displacement of the particle 595. In order to reduce this risk, it is expedient for the probe 100, 170, 212 or 242 to carry out a meandering movement around the path 930. By way of example, the probe 100, 170, 212 or 242 can carry out a movement on a circle segment whose circle center oscillates laterally around the path 930 and advances in the direction of the path.

While the displacement process of the particle 595 is being carried out, the AFM 365 or 375, which bears one of the probes 100, 150, 190 or the probe arrangement 200, preferably operates in a contact operating mode, i.e. the tip 120, 160, 215, 225, 235 or 245 thereof is in mechanical contact with the surface 620 of the layer 610, the surface 940 of the ramp 950 or the surface 970 of the pattern element 560. The cantilever 110, 170, 210, 220, 230 or 240 of the probe 100, 150, 190, 212, 222, 232 or 242 can be excited to oscillate during the displacement process of the particle 595, preferably at or close to the resonant frequency of the corresponding probe. However, it is also possible to operate the probe 100, 150, 190, 212, 222, 232 or 242 without oscillation. Furthermore, the probe 100, 150, 190, 212, 222, 232 or 242 can be operated in a closed feedback loop during the displacement of the particle 595. As a result, information about the path 930 and/or the particle 595 can be obtained during the displacement process. However, it is also possible to carry out the displacement of the particle 595 along the path 930 without a closed feedback loop.

The diagram 1000 in FIG. 10 presents the position of the particle 595 on the pattern element 560 after the end of the displacement process. On the pattern element 560, the particle has no disadvantageous influence on the exposure process of the mask. During operation of the photomask or during a cleaning process, however, the displaced particle 595 can once again pass to the transmissive or reflective layer 610 of the photomask.

Therefore, in the next or second step, the displaced particle 595 is fixed or immobilized on the pattern element 560. For this purpose, the particle 595 is embedded in material whose properties come as close as possible to the properties of the pattern element 560.

For the purpose of embedding and thus fixing the particle 595 on the pattern element 560, preferably a metal carbonyl, for example chromium hexacarbonyl ($Cr(CO_6)$) from the supply container 335 and the electron beam 310 of the apparatus 300 are provided at the location of the displaced particle 595. As necessary, an additive gas from the supply container 360 of the apparatus 300 is additionally delivered to the deposition site. Instead of a metal carbonyl, for example a metal halide, for instance titanium tetrachloride ($TiCl_4$), can be used as deposition gas. As illustrated schematically in FIG. 11, the displaced particle 595 is completely embedded into the deposit 1150.

Figure 12:
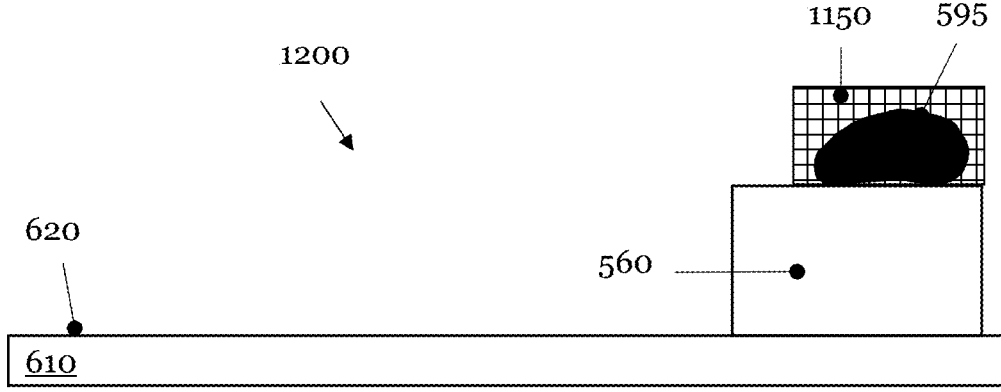
FIG. 12 presents FIG. 11 after removing the first temporary auxiliary structure or the ramp.

In the last step of this exemplary embodiment, the first temporary auxiliary structure 950 or the ramp 950 is removed again from the layer 610 of the photomask. The removal can be carried out in at least two ways. Firstly, the processing probe 212 of the probe arrangement 200 can be used to remove the ramp 950 from the surface 620 of the layer 610 by mechanical processing. The planar displacement probes 222 and/or 232 can also be used for parts of the mechanical processing of the first temporary auxiliary structure 950. Secondly, the ramp 950 can be eliminated by use of an EBIE process. For this purpose, it is possible to use for example the etching gases stored in the supply containers 345 and 350, water and a nitrogen oxide, in combination with the electron beam 310. In an alternative embodiment, it is possible to use the etching gas stored in the container 355, xenon difluoride ($XeF_2$), in interaction with the electron beam 310 for the purpose of removing the first temporary auxiliary structure 950. FIG. 12 shows the surface 620 of a mask, the particle 595 of which has been disposed of by fixing on the pattern element 560, after the removal of the first temporary auxiliary structure 950.

If the particle 595 is larger than the width of the pattern element, an attempt can be made to remove the particle 595 from the pattern element 560 with the aid of a cleaning process (not shown in FIG. 10). If this is not successful because the particle 595 is fixedly held by the surface 970 of the pattern element 560 by virtue of a high adhesion force, the particle 595 is divided by one of the probes 150, 222 or 232 and the debris fragments of the particle 595 are positioned on the pattern element 560 and fixed, as explained above in the context of FIG. 11.

Figure 13:
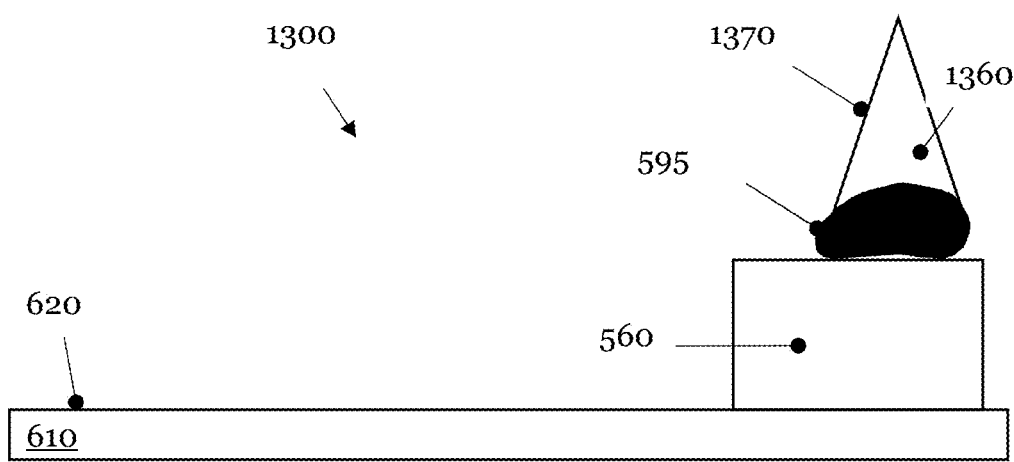
FIG. 13 illustrates FIG. 10 after enlarging the surface area of the particle displaced onto a pattern element and after removing the first temporary auxiliary structure.
Figure 14:
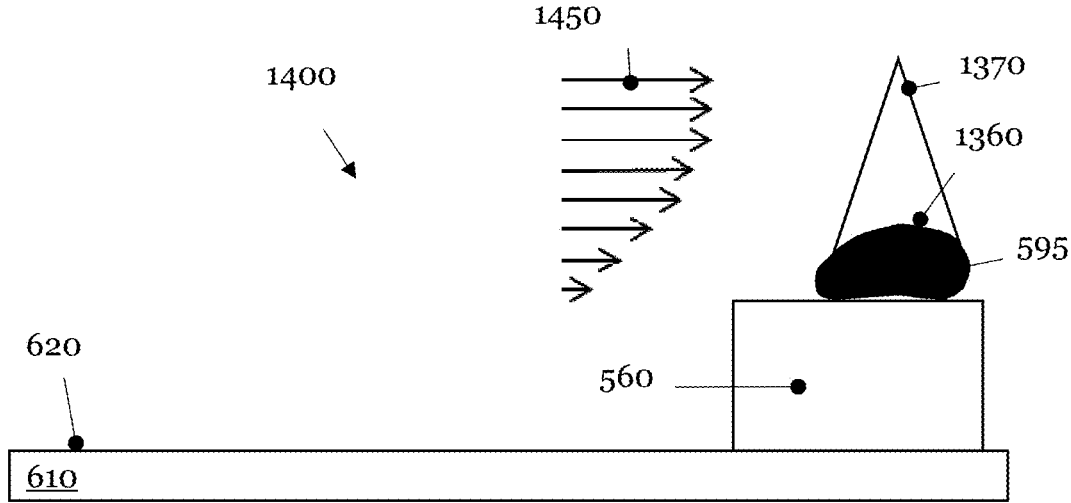
FIG. 14 reproduces FIG. 13, wherein the particle displaced onto the pattern element and having an enlarged surface area is subjected to a cleaning process, symbolized by the flow profile of a cleaning fluid.

The diagrams 900, 1000, 1200, 1300 and 1400 in FIGS. 9, 10, 12, 13 and 14 show a fifth exemplary embodiment, which is a modification of the above-described fourth example for disposing of excess material in the form of the particle 595. This modified exemplary embodiment begins with FIG. 9 and is identical to the above-described example up to FIG. 10. However, the particle 595 displaced onto pattern element 560 is not fixed. Rather, as discussed in the context of FIG. 7, the surface area 1370 of the particle 595 displaced onto the pattern element is enlarged by targeted deposition of material 1360. This is illustrated in FIG. 13. In the next step, then, as explained in the context of FIG. 12, the first temporary auxiliary structure 950 is removed again from the surface 620 of the layer 610. Finally, in a cleaning process indicated by the group of arrows 1450 in FIG. 14, the displaced and modified particle 595 is removed from the pattern element 560. The last two process steps mentioned can be interchanged.

By virtue of the fact that the particle 595 is displaced onto a pattern element 560 from a location on a transmissive or reflective layer 610 that is difficult to access for a cleaning process, and, in addition, the surface area 1370 of said particle is significantly enlarged, the particle 595 treated in this way is made accessible to the effect of a cleaning process. This modification mentioned last has the advantage that the pattern element 560 emerges without change from the process for disposal of the particle 595.

Figure 15:
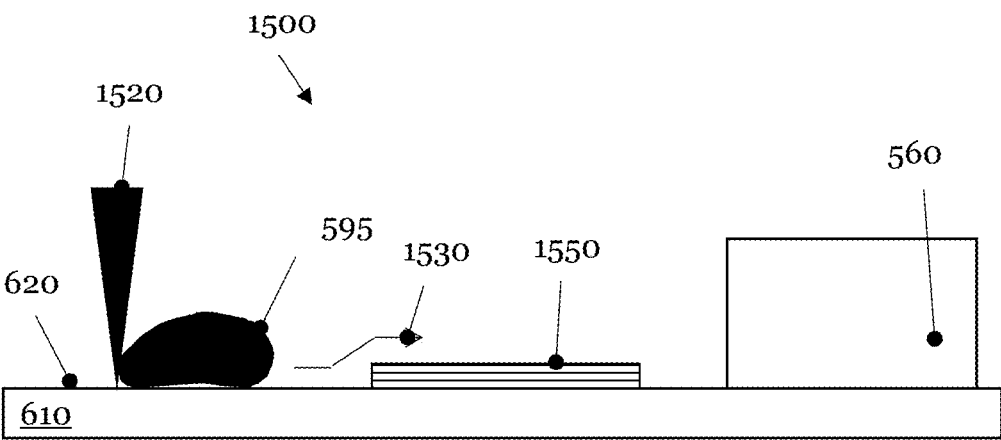
FIG. 15 schematically indicates the displacement path of a particle of excess material from a transmissive or a reflective region of a photomask onto a second temporary auxiliary structure.

A sixth exemplary embodiment for disposing of excess material of a photolithographic mask is explained with reference to the diagrams 1500 to 1700 in FIGS. 15 to 17. The diagram 1500 in FIG. 15 shows the particle 595 on the surface 620 of the layer 610 of a photomask. In the first step, in the vicinity of the particle 595, a second temporary auxiliary structure 1550 is deposited on the layer 620 in the form of a thin sacrificial layer. The layer of the second temporary auxiliary structure 1550 has a thickness of between a few nanometers and approximately 20 nm. Since only the surface properties of the deposited sacrificial layer 1550 are important for the removal of the particle 595, said sacrificial layer can be made very thin. The lateral dimensions of the second temporary auxiliary structure 1550 are adapted to the size of the particle 595. Typically, the area of the layer 1550 does not significantly exceed the dimension of the particle 595.

For the purpose of depositing the second temporary auxiliary structure 1550, one of the deposition gases stored in the supply containers 330 and 335 is usually taken, for instance an alkane, for example dodecane ($C_{12}H_{26}$). During the deposition of the second temporary auxiliary structure 1550, the deposition gas(es) and/or the process implementation is/are chosen such that a large proportion of carbon and/or molybdenum is incorporated into the deposited layer 1550. A large proportion of carbon and/or molybdenum in the deposit of the second temporary auxiliary structure 1550 has the advantage that the layer 1550 has only a limited durability and, as a result, can be removed again from the surface 620 of the layer 610 in a simple manner.

In the second step, the particle 595 is pushed along the path 1530 onto the sacrificial layer, functioning as second temporary auxiliary structure 1550, with the aid of the measurement tip 1520. One of the probes 150, 222 or 232 is advantageously used for carrying out the displacement of the particle 595. Details of a displacement process for a particle 595 on a photomask have already been explained in the context of FIG. 9.

Figure 16:
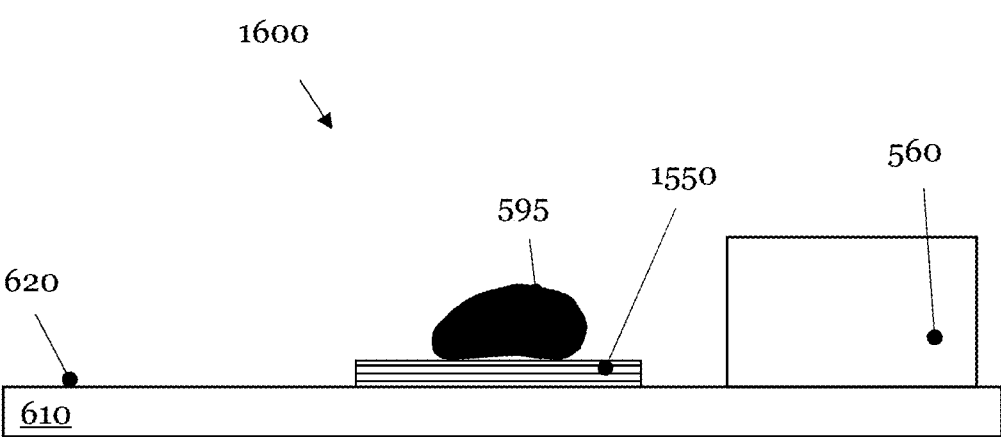
FIG. 16 reproduces FIG. 15 after carrying out the displacement process for the particle of excess material.

The diagram 1600 in FIG. 16 shows the position of the displaced particle 595 on the sacrificial layer of the second temporary auxiliary structure 1550. In the third and last step, the sacrificial layer of the second temporary auxiliary structure 1550 is removed together with the particle 595 from the layer 610 of the mask. This can once again be carried out in two ways.

On account of the material chosen, the sacrificial layer has only a limited adhesion to the surface 620 of the layer 610. Therefore, the second temporary auxiliary structure 1550 together with the particle 595 situated on it can be removed from the layer 610 in a cleaning process. For this purpose, it is possible to use one of the cleaning liquids introduced in the context of FIG. 4, such as, for example, the combination of sulfuric acid ($H_2SO_4$) and hydrogen peroxide ($H_2O_2$).

Proceeding from the initial situation illustrated in FIG. 16, in a second alternative embodiment it is also possible for the layer 1550 not to be removed by use of a cleaning process, but rather to be eliminated together with the particle 595 situated thereon in an EBIE process. For this local electron beam-induced etching process, recourse is normally had to the third etching gas stored in the supply container 355, $XeF_2$.

Figure 17:
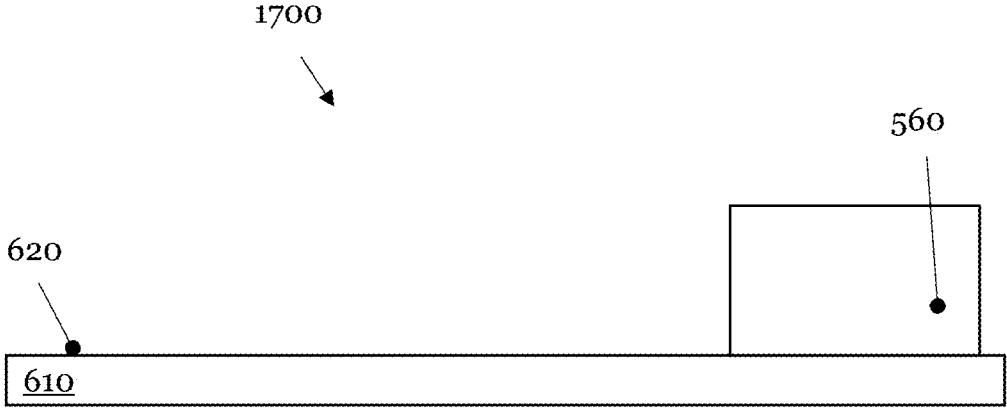
FIG. 17 illustrates FIG. 16 after the combined removal of the second temporary auxiliary structure and the particle situated thereon.

The diagram 1700 in FIG. 17 presents the surface 620 of the layer 610 of a mask after the removal of the second temporary protective layer 1550. In both alternative processes, the particle 595 was removed from the photomask without any residues.

The exemplary embodiment described last is expedient since only little material for the second temporary auxiliary structure 1550 need be deposited on the surface 620 of the layer 610. Furthermore, it is advantageous that the area of the second temporary auxiliary structure 1550 can be chosen in the vicinity of the particle 595, such that the displacement path 1530 for the particle 595 can be kept short. Finally, conveying the particle 595 onto the second temporary auxiliary structure 1550 is facilitated by the small height difference to be overcome on account of the thin sacrificial layer 1550.

Figure 18:
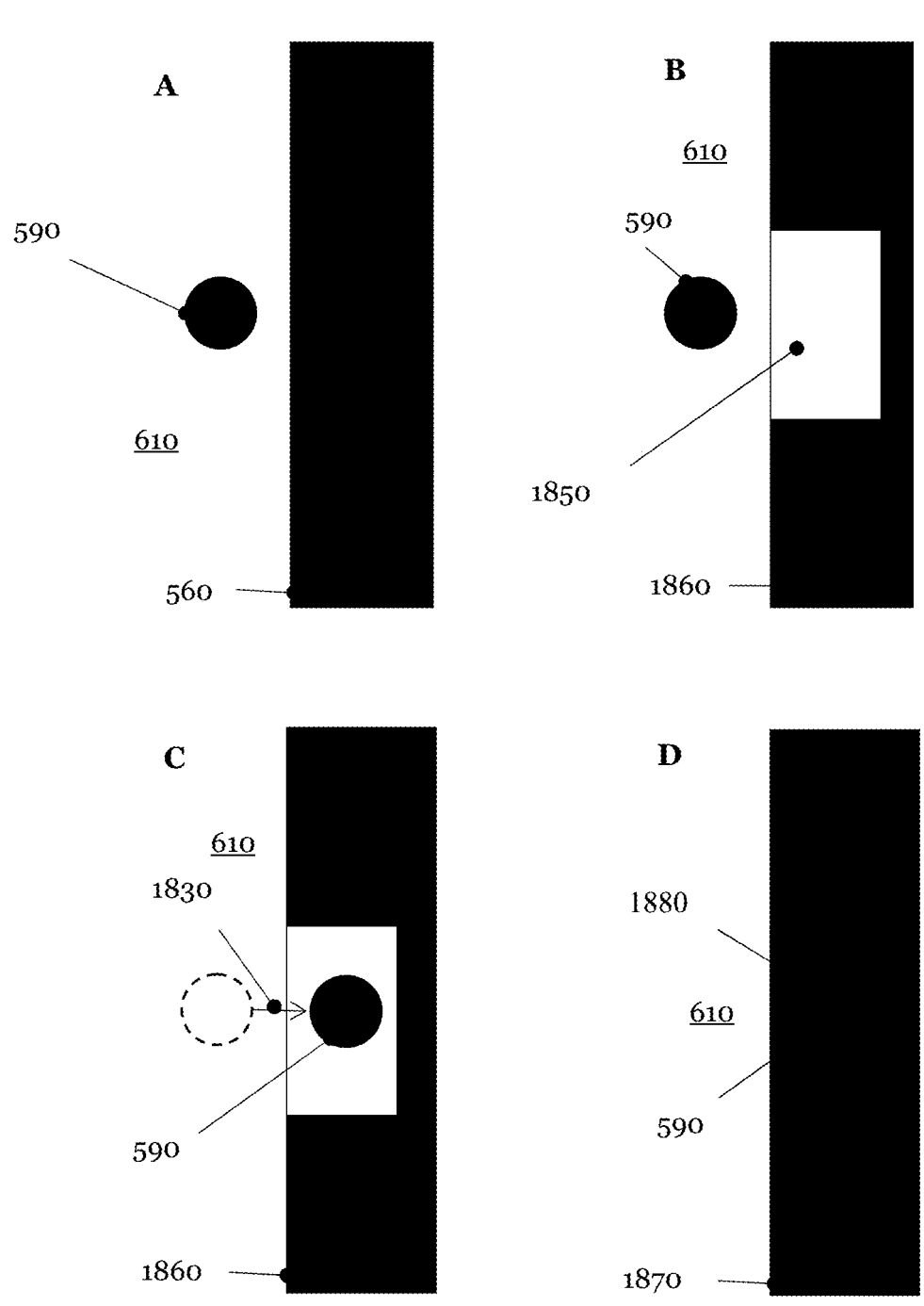
FIG. 18 illustrates a further exemplary embodiment for removing excess material by embedding into a pattern element of a photolithographic mask.

A further exemplary embodiment for disposing of excess material of a photolithographic mask is illustrated schematically in FIG. 18. Subfigure A shows a plan view of a pattern element 560 applied on a transmissive or reflective layer 610 of a photomask. Excess material in the form of a particle 590 is situated on the layer 610 in the vicinity of the pattern element 560.

In order to dispose of the particle 590, a part 1850 of the pattern element 560 is removed in a first step. The modified pattern element 1860 is reproduced schematically in subfigure B in FIG. 18. In a first embodiment, the material of the pattern element 560 is removed mechanically with the aid of the processing probe 222 of the probe arrangement 200. Additionally or alternatively, the probes 222 and/or 232 of the probe arrangement 200 that are optimized for displacement purposes can be used for this task.

In an alternative embodiment, the part 1850 of the pattern element 560 is etched away by use of an EBIE process. By way of example, the xenon difluoride (XeF$_2$) stored in the supply container 355 can be used as etching gas. As necessary, an additive gas stored in the supply container 360, for example water, is admixed with the etching gas.

In the second step, which is illustrated schematically in subfigure C in FIG. 18, the particle 590 is pushed into the region 1850 of the pattern element 1860, said region having been cleared of absorbing material. The probe 150 from FIG. 1 or one of the probes 222 and/or 232 of the probe arrangement 200 from FIG. 2 can be used for this purpose. Details of a displacement process for excess material 590, 595 have been described in the context of FIG. 9.

Finally, in the third step, which is illustrated in subfigure D in FIG. 18, material is deposited around the displaced particle 590, such that after the conclusion of the deposition process the pattern element 1870 has its original form to the greatest possible extent, namely that of the original pattern element 560. The displaced particle 590 is completely enclosed by the deposit 1880 and thus fixed at its displaced location. For the purpose of depositing the absorbing material of the pattern element 1860 that is missing in the region 1850, a deposition gas is selected which produces a deposit 1880 whose optical and mechanical properties come as close as possible to those of the material of the pattern element 560. A third deposition gas stored in the supply container 335 is typically used for this purpose. This may be for example a metal carbonyl or a metal halide, advantageously chromium hexacarbonyl (Cr(CO)$_6$), triruthenium dodecacarbonyl (Ru$_3$(CO)$_{12}$) or titanium tetrachloride (TiCl$_4$), since these metals are often important constituents of the pattern elements 560 of photolithographic masks. For transmissive photomasks, TEOS can also be used for this purpose.

The example described last has the advantage that no temporary auxiliary structure need be deposited on the surface 620 of the layer 610 and the pattern elements have no change in shape after the conclusion of the disposal process.

In the example explained in the context of FIG. 18, the absorbing material of the pattern element 560 has been removed down to the surface 620 of the layer 610. However, it is also possible to remove the absorbing material of the pattern element 560 to a depth which is sufficient to cause the displaced particle 580 to completely disappear in the region 1850 of the modified pattern element 560. When choosing this variant, it may be necessary to use the first temporary auxiliary structure in the form of a ramp, as discussed in association with the fourth embodiment, in order to convey the particle 590 into the modified region 1850 of the pattern element.

Figure 19:
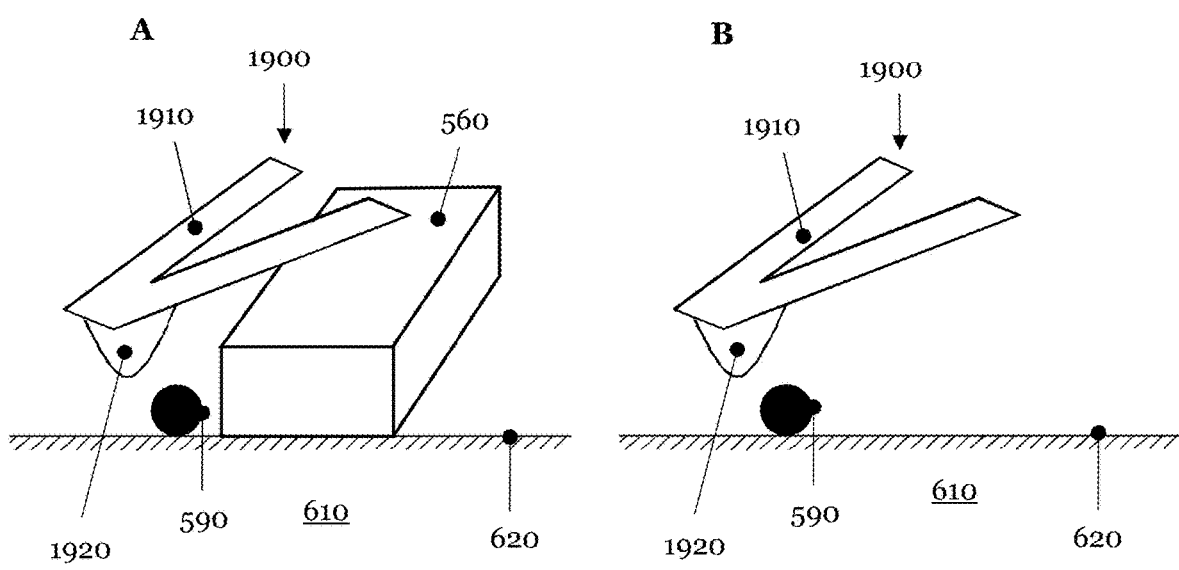
FIG. 19 shows a partial removal of a pattern element of a photolithographic mask in order to obtain access to excess material.

FIG. 19 represents a first example, in which excess material in the form of the particle 590 cannot be scanned, or can be scanned only with great uncertainty, by a probe

1900 of an AFM 365 or 375. As indicated schematically in subfigure A, the particle 590 was adsorbed in direct proximity to the pattern element on the surface 620 of the layer 610. The pattern element 560 prevents the cantilever 1910 of the probe 1900 from being able to be moved such that the measurement tip 1920 thereof can reproducibly scan the particle 590 of excess material. By removing that part of the pattern element 560 which is illustrated in subfigure A, as explained in the discussion of subfigure A in FIG. 18, the probe 1900 gains access to the particle 590 and can scan the latter with great precision. This is shown in subfigure B in FIG. 19.

In the next step, the particle 590 is preferably pushed to a desired location by one of the probes 150, 222 or 232 (not shown in FIG. 19). The removed part of the pattern element 560 is then deposited at the original location and in the original form again (not illustrated in FIG. 19). The details in this respect have been explained in association with the discussion of FIG. 18.

Figure 20:
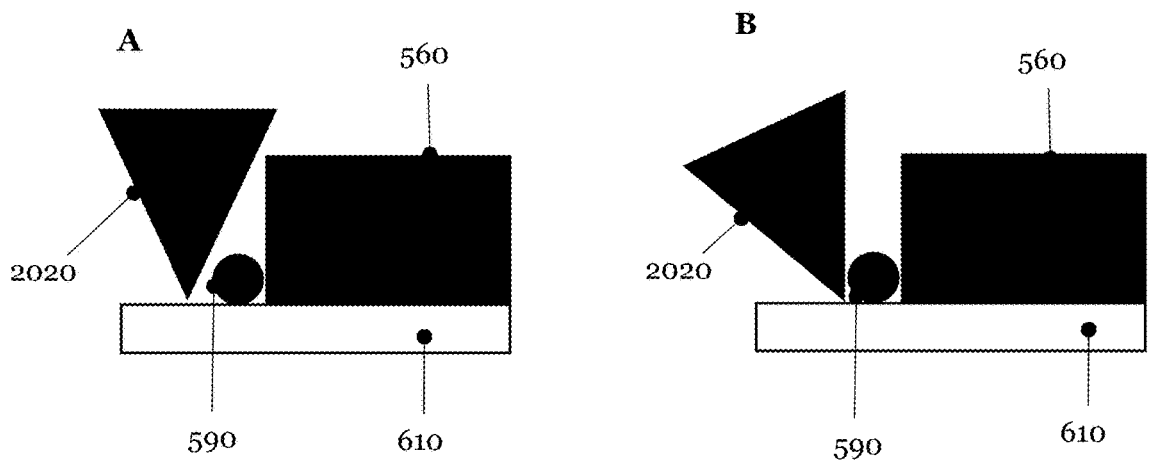
FIG. 20 illustrates the tilting of a measurement tip of a probe by torsion of the cantilever of the probe in order to acquire access to excess material that deposited on a pattern element of a photolithographic mask.

FIG. 20 shows a second example, in which excess material in the form of the particle 590 can be detected by a measurement tip 2020. As illustrated schematically in subfigure A in FIG. 20, the particle 560 is situated—in a manner similar to that in FIG. 19—in direct proximity to the pattern element 560. The measurement tip 2020 has a large radius of curvature, such that the pattern element 560 prevents the detection of the particle 590 by the measurement tip 2020.

A first possibility for solving this difficulty is afforded by the probe arrangement 200 described in the context of the discussion of FIG. 2 and having probes 242 and 252 designed specifically for analysis purposes. If a probe arrangement is not available, the lower part of FIG. 1 describes a second possibility for obtaining access to the particle 590 in FIG. 20. By way of example, by use of asymmetrical heating of the cantilever 170 of the probe 190, the cantilever 170 can be rotated or subjected to torsion, such that the measurement tip 120 or 2020 moves in the y-direction. This is illustrated in subfigure B in FIG. 20. As a result of the torsion of the cantilever 170, the measurement tip 120, 2020 thereof can reliably scan the particle 590 despite the proximity thereof to the pattern element 560. Details concerning the torsion of a cantilever 170 are explained in the published patent application DE 10 2014 212 311 A1 in the name of the applicant.

In the next step, the measurement tip 120, 2020 of the rotated cantilever 170 can push the particle 590 away from the pattern element 560. As soon as the particle 590 is at a corresponding distance from the pattern element, the further displacement path can be implemented without rotation or torsion of the cantilever 170.

Figure 21:
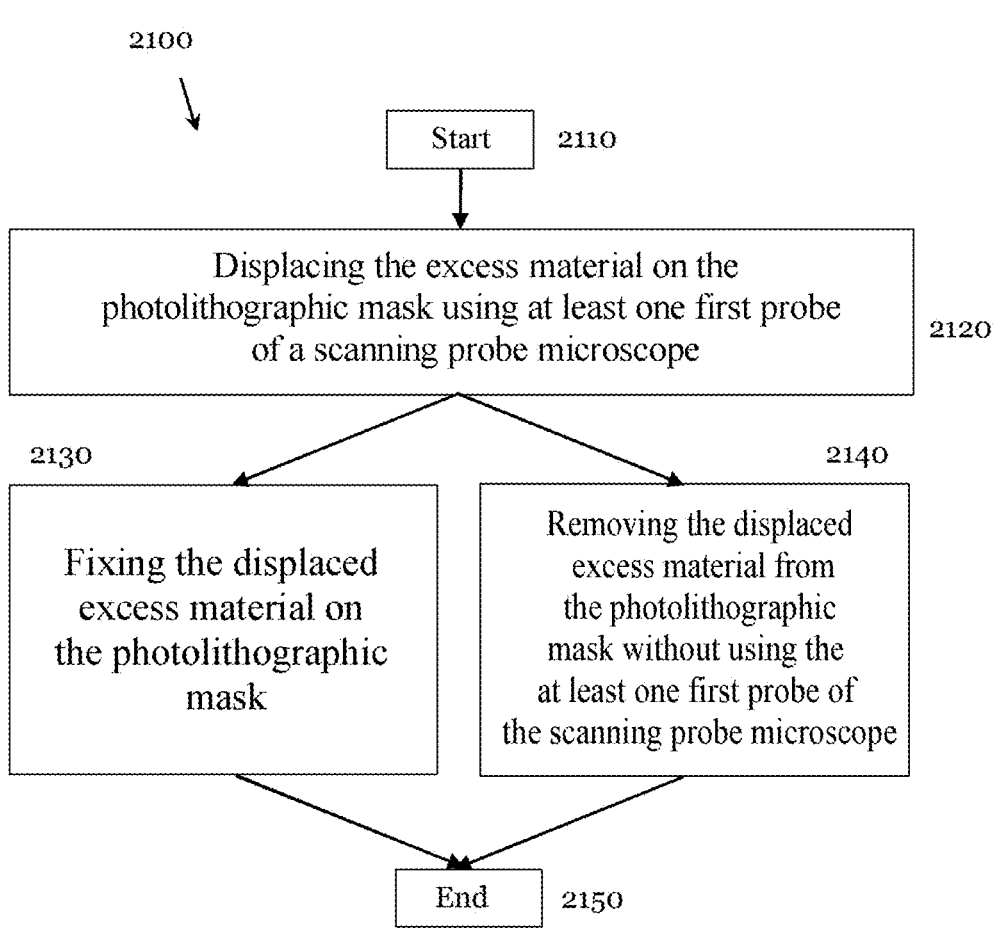
FIG. 21 reproduces a flow diagram of a method for disposing of excess material of a photolithographic mask.

The flow diagram 2100 in FIG. 21 presents a method for disposing of excess material 590, 595 of a photolithographic mask 500. The method begins in step 2110. Step 2120 involves displacing the excess material 590, 595 on the photolithographic mask 500 using at least one probe 100, 150, 190, 212, 222, 232, 242 of a scanning probe microscope 300, 400. The method then branches. Step 2130 involves fixing the displaced excess material 590, 595 on the photolithographic mask 500. This can be done in a plurality of embodiments. Alternatively, step 2140 involves removing the displaced excess material 590, 595 from the photolithographic mask 500 without using the at least one probe 100, 150, 190, 212, 222, 232, 242 of the scanning probe microscope 300, 400. A plurality of exemplary embodiments is likewise indicated above for this step. The method ends in step 2150.

Figure 22:
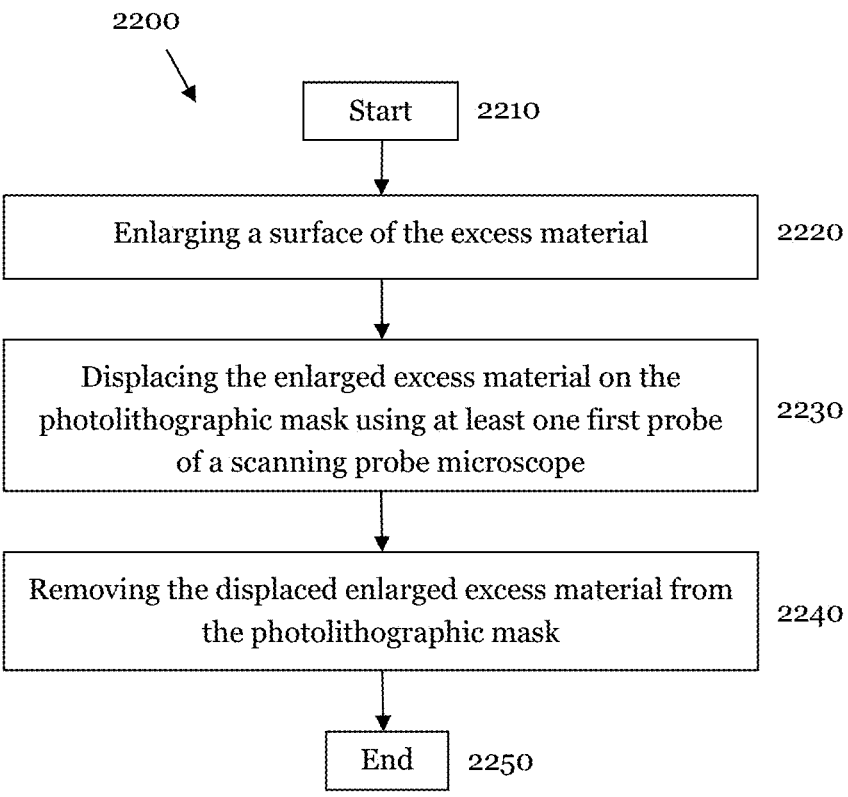
FIG. 22 represents a flow diagram of a further method for disposing of excess material of a photolithographic mask.

Finally, the flow chart 2200 in FIG. 22 represents a further method for disposing of excess material 590, 595 of a photolithographic mask 500. The method begins in step 2210. At step 2120 a surface of the excess material is enlarged. This can be done by depositing material onto the surface of the excess material. The deposition can be performed by use of a particle beam-induced deposition process. Next, at step 2230 the enlarged excess material 590, 595 is displaced on the photolithographic mask 500 using at least one probe 100, 150, 190, 212, 222, 232, 242 of a scanning probe microscope 300, 400. At step 2240 the displaced enlarged excess material 590, 595 is removed from the photolithographic mask 500. The removal of the displaced enlarged excess material can be performed by use of a probe of a scanning probe microscope or by a cleaning process. The method ends in step 2250.

What is claimed is:

1. A method comprising:

providing a deposition gas;

providing at least one additive gas comprising ammonia;

providing a particle beam incident on a surface of excess material arranged on a surface of the mask, wherein the excess material is displaceable;

displacing the excess material from a transmissive or reflective region of the photolithographic mask to a region of an absorbing pattern element of the photo-lithographic mask;

depositing a first material onto the excess material while the excess material is on the absorbing pattern element of the photolithographic mask, the depositing being performed based at least in part on the deposition gas, the additive gas and the particle beam and enlarging the excess material; and removing enlarged excess material from the photolitho-graphic mask.

2. The method of claim 1, wherein the at least one additive gas further comprises an oxidant.

3. The method of claim 2, wherein the at least one oxidant comprises nitrogen dioxide.

4. The method of claim 2, wherein the at least one oxidant comprises water vapor.

5. The method of claim 2, wherein the at least one oxidant comprises oxygen.

6. The method of claim 1, wherein the material is deposited to replace an absent part of a pattern element of the photolithographic mask.

7. The method of claim 1, wherein the first material is an absorbing material.

8. The method of claim 1, wherein the first material comprises chromium.

9. The method of claim 1, wherein the first material comprises chromium nitride.

10. The method of claim 1, wherein the deposition gas comprises a metal carbonyl.

11. The method of claim 10, wherein the metal carbonyl comprises a chromium carbonyl.

12. The method of claim 11, wherein the metal carbonyl comprises a chromium hexacarbonyl.

13. The method of claim 1, wherein the particle beam comprises an electron beam.

14. The method of claim 13, wherein the first material is deposited based at least in part on an electron beam induced deposition.

15. The method of claim 1, wherein the particle beam induces a local chemical reaction of the deposition gas at the point of incidence on the surface.

16. The method of claim 1 wherein depositing the first material comprises nanostructuring of the excess material by use of an electron beam-based or electron beam-induced deposition process.

17. The method of claim 1 wherein removing the enlarged excess material comprises applying the cleaning fluid to an enlarged surface area of the enlarged excess material.

18. The method of claim 1 wherein targeted deposition of the material onto the surface of the excess material comprises targeted deposition of at least one of carbon, metal carbonyl, or metal halide over a small area on the excess material.

19. The method of claim 1 wherein the excess material is displaceable as a whole on the surface of the photolitho-graphic mask, and wherein after the targeted depositing of the first material, no additional first material is deposited on the surface of the mask in the area surrounding the excess material prior to removal of the excess material, the area surrounding the excess material remains free of deposited first material prior to removal of the excess material.

20. The method of claim 1 wherein depositing the first material comprises targeted deposit of the first material onto the surface of the excess material to increase a height of the excess material without depositing the first material onto the surface of the mask in the area surrounding the excess material.

21. The method of claim 20 wherein removing the enlarged excess material from the photolithographic mask comprises removing the enlarged excess material from the photolithographic mask using a cleaning fluid, wherein the increased height is configured to enable the excess material with the increased height to be impinged by a portion of the cleaning fluid flowing at a higher velocity at a higher height relative to the surface of the mask, as compared to a portion of the cleaning fluid flowing at a lower velocity at a lower height relative to the surface of the mask, and enable the excess material with the increased height to be removed from the surface of the mask by the cleaning fluid.

22. A method comprising:

providing a deposition gas;

providing at least one additive gas comprising ammonia;

providing a particle beam incident on a surface of excess material arranged on a surface of the photolithographic mask;

displacing the excess material from a transmissive or reflective region of the photolithographic mask to a region of an absorbing pattern element of the photo-lithographic mask;

depositing a first material onto the excess material while the excess material is on the absorbing pattern element of the photolithographic mask, the depositing being performed based at least in part on the deposition gas, the additive gas and the particle beam and enlarging the excess material to form enlarged excess material, wherein the first material comprises at least one of carbon, a metal carbonyl, or a metal halide; and removing the enlarged excess material from the photo-lithographic mask.

23. The method of claim 22 wherein the excess material is displaceable as a whole on the surface of the photolitho-graphic mask, and wherein depositing the first material comprises targeted deposit of the first material onto the surface of the excess material to increase a height of the enlarged excess material without depositing the first material onto the surface of the mask in the area surrounding the excess material.

24. The method of claim 23 wherein after the targeted depositing of the first material, no additional first material is deposited on the surface of the mask in the area surrounding the excess material prior to removal of the excess material, the area surrounding the excess material remains free of deposited first material prior to removal of the excess material.

25. The method of claim 22 wherein removing the enlarged excess material from the photolithographic mask comprises removing the enlarged excess material from the photolithographic mask using a cleaning fluid, and wherein the enlarged excess material has an increased height configured to enable the enlarged excess material to be impinged by a portion of the cleaning fluid flowing at a higher velocity at a higher height relative to the surface of the mask, as compared to a portion of the cleaning fluid flowing at a lower velocity at a lower height relative to the surface of the mask, and enable the enlarged excess material to be removed from the surface of the mask by the cleaning fluid.

26. A method comprising:

processing a photolithographic mask having excess material on a surface of the mask, comprising:

displacing the excess material from a transmissive or reflective region of the photolithographic mask to a region of an absorbing pattern element of the photolithographic mask;

prior to applying a cleaning process that uses a cleaning fluid to clean the mask, performing targeted deposition of a first material on the excess material while the excess material is on the absorbing pattern element of the photolithographic mask, the targeted deposition being performed to increase a height of the excess material, wherein the excess material prior to the targeted deposition has a first height and after the targeted deposition has a second height; and applying the cleaning process by using the cleaning fluid to remove the excess material having the second height, wherein the cleaning fluid has a lower flow velocity at the first height and a higher flow velocity at the second height, the second height is selected to enable the excess material having the second height to be removed by the cleaning fluid with the higher flow velocity.

27. The method of claim 26 wherein the targeted deposition comprises:

providing a deposition gas;

providing at least one additive gas comprising ammonia;

providing a particle beam incident on a surface of the excess material; and depositing the first material onto the excess material based at least in part on the deposition gas, the additive gas and the particle beam.

* * * * *